(12) United States Patent
Minami et al.

(10) Patent No.: US 7,138,312 B2
(45) Date of Patent: Nov. 21, 2006

(54) SEMICONDUCTOR DEVICE AND METHOD FOR FABRICATING THE SAME

(75) Inventors: Takayoshi Minami, Kawasaki (JP); Yuji Setta, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 11/416,132

(22) Filed: May 3, 2006

(65) Prior Publication Data
US 2006/0199318 A1   Sep. 7, 2006

Related U.S. Application Data

(62) Division of application No. 10/788,379, filed on Mar. 1, 2004, now Pat. No. 7,064,395.

(30) Foreign Application Priority Data
Aug. 22, 2003 (JP) .............................. 2003-298678

(51) Int. Cl.
*H01L 21/8238* (2006.01)
(52) U.S. Cl. ................ 438/233; 438/199; 257/E27.098
(58) Field of Classification Search ................ 438/152, 438/199, 200, 233
See application file for complete search history.

(56) References Cited
U.S. PATENT DOCUMENTS
6,696,732 B1   2/2004   Matsuoka et al.
6,765,272 B1   7/2004   Natsume
6,812,574 B1   11/2004  Tomita et al.

FOREIGN PATENT DOCUMENTS
| JP | 9-55440 | 2/1997 |
| JP | 9-162354 | 6/1997 |
| JP | 2001-93974 | 4/2001 |
| JP | 2003-45961 | 2/2003 |
| JP | 2003-131400 | 5/2003 |

*Primary Examiner*—Hoai Pham
*Assistant Examiner*—Mursalin B. Hafiz
(74) *Attorney, Agent, or Firm*—Westerman, Hattori, Daniels & Adrian, LLP.

(57) ABSTRACT

The semiconductor device comprises a gate interconnection 24a including a gate electrode formed over a semiconductor substrate 14 with a gate insulation film 22 formed therebetween; a first source/drain diffused layer 28 formed near the end of the gate interconnection 24a; a second source/drain diffused layer 34 formed remote from the gate interconnection 24a and the first source/drain diffused layer 28; and an insulation film 40 formed over the gate interconnection 24a, the first source/drain diffused layer 28 and the second source/drain diffused layer 34, and having a groove-shaped opening 42a formed in, which integrally exposes the gate interconnection 24a, one of the first source/drain diffused layer 28, and one of the second source/drain diffused layer 34; and a contact layer 48a buried in the groove-shaped opening 42a. The groove-shaped openings 42a for the contact layers 48a to be buried in can be formed without failure. Accordingly, it is possible to provide a semiconductor device which can realize the micronization without reliability decrease and fabrication yield decrease.

4 Claims, 34 Drawing Sheets

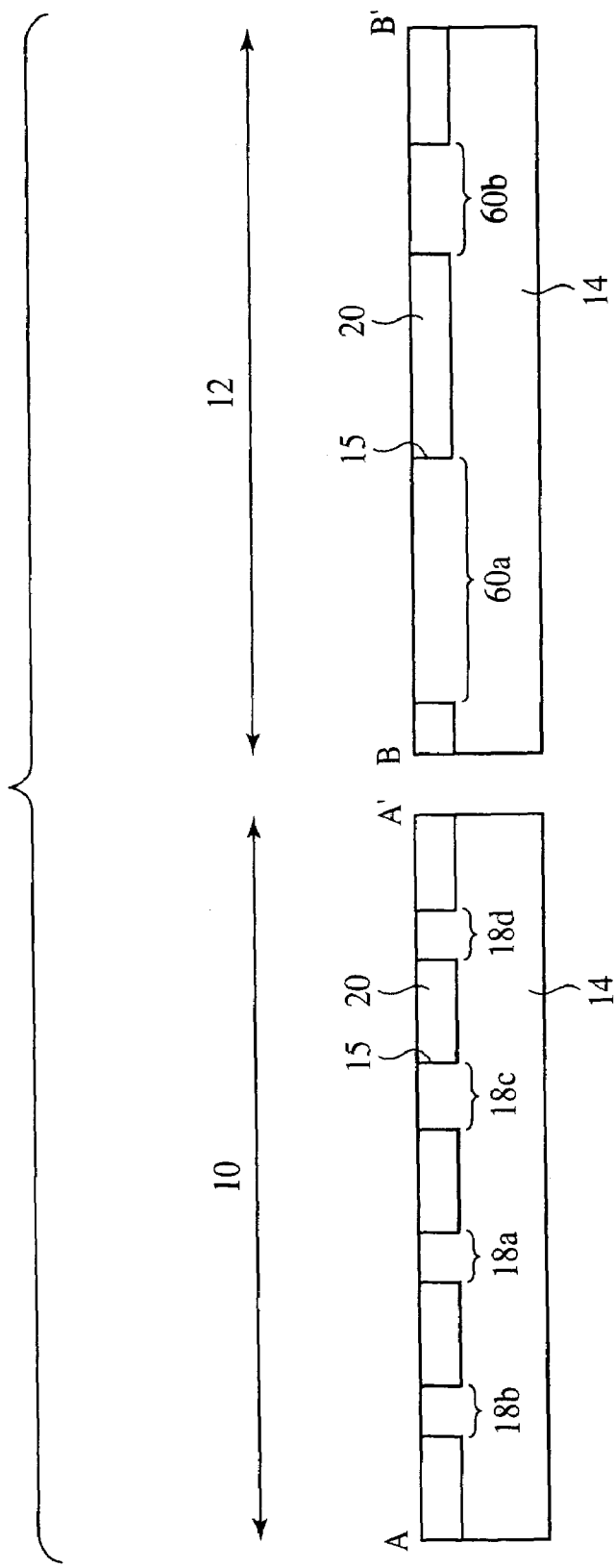

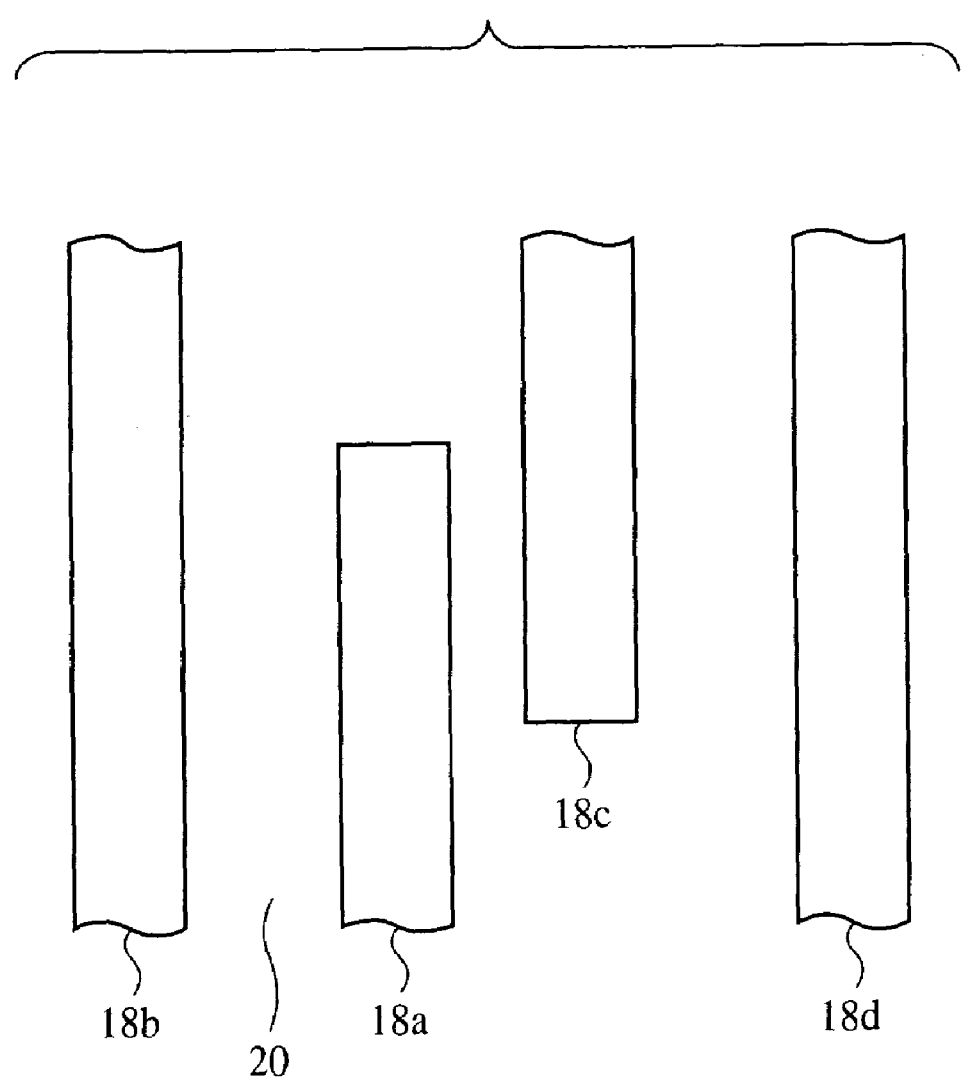

SEMICONDUCTOR DEVICE AND METHOD FOR FABRICATING THE SAME

CROSS-REFERENCE TO RELATED APPLICATION

This is a Division of application Ser. No. 10/788,379 filed Mar. 1, 2004, now U.S. Pat. No. 7,064,395, which application is based upon and claims priority of Japanese Patent Application No. 2003-298678, filed on Aug. 22, 2003, the contents being incorporated herein by reference.

BACKGROUND OF THE INVENTION

The present invention relates to a semiconductor device and a method for fabricating the semiconductor device, more specifically a semiconductor device which can realize further micronization and a method for fabricating the semiconductor device.

SRAM (Static Random Access Memory) is a semiconductor memory device the memory cell of which is a flip-flop circuit and which is operative at high speed. A CMOS-type SRAM, which comprises the load transistor in the form of a p-channel transistor and the driver transistor in the form of an n-channel transistor, is prevalently used in fields requiring very little source current in stand-by and small consumption electric power.

In the process of fabricating the CMOS-type SRAM, 6 transistors forming a basic unit of the memory cell are formed on a semiconductor substrate, then an inter-layer insulation film for covering the transistors are formed, and an interconnection interconnecting the electrodes of the respective transistors is formed on the inter-layer insulation film.

The proposed SRAM will be explained with reference to FIGS. 33 and 34. FIG. 33 is a sectional view of the proposed SRAM. FIG. 34 is a plan view of the proposed SRAM, which show the pattern thereof.

P-type wells 116p and n-type wells 116n are formed on a semiconductor substrate 114. On the semiconductor substrate 114 with the p-type wells 116p and the n-type wells 116n formed on, device isolation regions 120 for defining device regions 118a–118d are formed. Gate interconnections 124a–124d are formed on the semiconductor substrate 114 with a gate insulation film 122 formed on. A sidewall insulation film 126 is formed on the side walls of the gate interconnections 124a–124d.

The gate interconnection 124a is formed, crossing the device regions 118a, 118b. The gate interconnection 124a includes the gate electrode of a load transistor L1 and the gate electrode of a driver transistor D1 and commonly connects the gate electrode of the load transistor L1 and the gate electrode of the driver transistor D1. In the device region 118a on both side of the gate interconnection 124a, a source/drain diffused layer 130, 131 is formed. The gate electrode 124a and the source/drain diffused layer 130, 131 form the load transistor L1. In the device region 118b on both side of the gate interconnection 124a, a source/drain diffused layer 132, 133 is formed. The gate electrode 124a and the source/drain diffused layer 132, 133 form the driver transistor D1.

The gate interconnection 124b is formed, crossing the device regions 118c, 118d. The gate interconnection 124b includes the gate electrode of a load transistor L2 and the gate electrode of a driver transistor D2 and commonly connects the gate electrode of the load transistor L2 and the gate electrode of the driver transistor D2. In the device region 118c on both side of the gate interconnection 124b, a source/drain diffused layer 128, 129 is formed. The gate electrode 124b and the source/drain diffused layer 128, 129 form the load transistor L2. In the device region 118d on both side of the gate interconnection 124b, a source/drain diffused layer 134, 135 is formed. The gate electrode 124b and the source/drain diffused layer 134, 135 form the driver transistor D2.

The gate interconnection 124c is formed, crossing the device region 118b. The gate interconnection 124c includes the gate electrode of a transfer transistor T1 and commonly connects the gate electrodes of the transfer transistors T1 formed in the memory cells adjacent to each other. In the device region 118b on both sides of the gate interconnection 124c, a source/drain diffused layer 132, 136 are formed. The gate electrode 124c and the source/drain diffused layer 132, 136 form the transfer transistor T1.

The gate interconnection 124d is formed, crossing the device region 118d. The gate interconnection 124d includes the gate electrode of a transfer transistor T2 and commonly connects the gate electrode of the transfer transistor T2 formed in the memory cells adjacent to each other. In the device region 118d on both sides of the gate interconnection 124d, a source/drain diffused layer 134, 137 is formed. The gate electrode 124d and the source/drain diffused layer 134, 137 form the transfer transistor T2.

A stopper film 138 is formed on the semiconductor substrate 114 with these transistors L1, L2, D1, D2, T1, T2. An inter-layer insulation film 140 is formed on the semiconductor substrate with the stopper film 138.

Contact holes 142 are formed in the inter-layer insulation film 140 down to the gate interconnections 124a–124d and the source/drain diffused layer 128–137. In the contact holes 142, a contact layer 148, 148a, 148b formed of a barrier film 144 and a tungsten film 146 is buried. The gate interconnection 124a and the source/drain diffused layer 128 are interconnected to each other by the contact layer 148a. The gate interconnection 124b and the source/drain diffused layer 130 are interconnected to each other by the contact layer 148b.

A stopper film 174 is formed on the inter-layer insulation film 140 with the contact layer 148, 148a, 148b buried in. An inter-layer insulation film 176 is formed on the stopper film 174. Groove-shaped openings 178 for exposing the contact layer 148 are formed in the inter-layer insulation film 176. In the groove-shaped openings 178, interconnections 150 formed of a barrier film 180 and a Cu film 181 is buried.

Thus, the proposed SRAM is constituted.

Following references disclose the background art of the present invention.

[Patent Reference 1]
Specification of Japanese Patent Application Unexamined Publication No. 2003-45961

[Patent Reference 2]
Specification of Japanese Patent Application Unexamined Publication No. 2001-93974

[Patent Reference 3]
Specification of Japanese Patent Application Unexamined Publication No. Hei 9-162354

[Patent Reference 4]
Specification of Japanese Patent Application Unexamined Publication No. Hei 9-55440

[Patent Reference 5]
Specification of Japanese Patent Application Unexamined Publication No. 2003-131400

Recently, for lower costs and larger capacities, the memory cell is required to be further micronized. To micronize the memory cell, it is very important to form micronized contact holes without failure. As techniques which can form micronized contact holes are proposed the technique using modified light, such as zonal light or others, the technique using a halftone phase shift mask, the technique forming an auxiliary pattern (assist pattern or scattering bar), and other techniques. However, these techniques have found it very difficult to form about 90 nm×90 nm micronized contact holes without failure. Accordingly, further micronization leads to reliability decrease and lower fabrication yields.

SUMMARY OF THE INVENTION

An object of the present invention is to provide a semiconductor device which can realize the micronization without reliability decrease and fabrication yield decrease, and a method for fabricating the semiconductor device.

According to one aspect of the present invention, the present invention provides a semiconductor device comprising: a gate interconnection formed over a semiconductor substrate with a gate insulation film formed therebetween and including a gate electrode; a first source/drain diffused layer formed in the semiconductor substrate near the end of the gate interconnection; a second source/drain diffused layer formed in the semiconductor substrate remote from the gate interconnection and the first source/drain diffused layer; an insulation film formed over the gate interconnection, the first source/drain diffused layer and the second source/drain diffused layer and having a groove-shaped opening for integrally exposing the gate interconnection, one of the first source/drain diffused and one of the second source/drain diffused layer; and a contact layer buried in the groove-shaped opening.

According to another aspect of the present invention, the present invention provides a method for fabricating a semiconductor device comprising a first inverter including a first load transistor and a first driver transistor, and a second inverter including a second load transistor and a second driver transistor, the method further comprising the steps of: forming over a semiconductor substrate a first gate interconnection including the gate electrode of the first load transistor, and the gate electrode of the first driver transistor; and a second gate interconnection including the gate electrode of the second load transistor and the gate electrode of the second driver transistor; forming a source/drain diffused layer in the semiconductor substrate of both sides of the respective gate electrodes; forming an insulation film over the semiconductor substrate, the first gate interconnection and the second gate interconnection; forming in the insulation film a first groove-shaped opening for integrally exposing the first gate interconnection, one of the source/drain diffused layer of the second load transistor and one of the source/drain diffused layer of the second driver transistor; and a second groove-shaped opening for integrally exposing the second gate interconnection, one of the source/drain diffused layer of the first load transistor and one of the source/drain diffused layer of the first driver transistor; and burying a contact layer in the first opening and the second opening.

In the present invention, the contact layer is buried in the groove-shaped opening for exposing the gate interconnection, the source/drain diffused layer of the second load transistor, and the source/drain diffused layer of the second driver transistor, and the contact layer connects the gate interconnection, the source/drain diffused layer of the second load transistor and the source/drain diffused layer of the second driver transistor. In the present invention, another contact layer is buried in another groove-shaped opening for exposing another gate interconnection, the source/drain diffused layer of the first load transistor and the source/drain diffused layer of the first driver transistor, and said another contact layer connects said another gate interconnection, the source/drain diffused layer of the first load transistor and the source/drain diffused layer of the first driver transistor. The openings for the contact layer and said another contact layer to be buried in are formed in groove-shapes, which can make the pattern occupation ratio by the patterns of the openings can be higher in comparison with that of hole-shaped contact holes having small length and breadth diameters. This permits the oblique incidence illumination, which is suitably used in cases of high pattern occupation ratios, to be used in exposing the patterns of the groove-shaped openings, and the advantages of the oblique incidence illumination can be exerted. Thus, according to the present invention, the groove-shaped openings for the contact layers to be buried in can be formed without failure. Accordingly, the present invention can provide a semiconductor device which does not lower the reliability and fabrication yield even when micronized.

In the present invention, the contact layers are respectively buried in the groove-shaped openings which respectively expose the source/drain diffused layer of the load transistor, the source/drain diffused layer of the driver transistor, the gate electrode of the transfer transistor and the source/drain diffused layer of the transfer transistor. The openings for the contact layers to be buried in are formed in groove-shapes, and can be formed without failure even when micronized. Accordingly, the present invention can provide a semiconductor device which does not lower the reliability and fabrication yield even when micronized.

According to the present invention, the interconnections are formed on the inter-layer insulation films in the memory cell region, whereby the formation of a large step on the substrate surface can be prevented in polishing the interconnection materials by CMP. Thus, the present invention can fabricate the semiconductor device of high reliability with high fabrication yields.

Furthermore, in the memory cell region, the contact layers are buried in the groove-shaped openings, and in the peripheral circuit region, the contact layers are buried in the usual contact holes of the same length and breadth diameters, whereby high density can be realized in the memory cell region, and in the peripheral region, high speed can be realized.

According to the present invention, not only in the memory cell region but also in the peripheral circuit region, the groove-shaped openings are formed in the inter-layer insulation film, and the contact holes are buried in the groove-shaped openings. The groove-shaped openings for the contact layers to be buried in can be formed without failure even when micronized. Thus, according to the present invention, the peripheral circuit region can be also micronized without lowering the reliability and fabrication yield.

According to the present invention, the contact layer is formed diagonally to the longitudinal direction of the gate interconnection in the region near the gate interconnection. This allows the gate interconnection, the source/drain diffused layer of the second load transistor and the source/drain diffused layer of the second driver transistor to be connected by the contact layer without failure even when disalignment takes place in forming the patterns. Another contact layer is formed diagonally to the longitudinal direction of another gate interconnection in the region near said another gate interconnection, which allows said gate interconnection, the source/drain diffused layer of the first load transistor and the source/drain diffused layer of the first driver transistor to be connected by another contact layer without failure even when disalignment takes place in forming the patterns. In forming the gate interconnection and another gate interconnection, even when the forward ends of the patterns of the gate interconnection and another gate interconnection should be set back, the gate interconnection and the source/drain diffused layer of the second load transistor and the source/drain diffused layer 34 of the second driver transistor, and another gate interconnection, the source/drain diffused layer of the first load transistor and the source/drain diffused layer of the second driver transistor can be connected without failure. Accordingly, the present invention can provide the semiconductor device of high reliability with high fabrication yields.

According to the present invention, the contact layer is buried in the groove-shaped opening which exposes the lower interconnection, and the lower interconnection and the upper interconnection are connected by the contact layer buried in the groove-shaped opening. The groove-shaped opening can be formed without failure even when micronized and can be filled with the contact layer without failure. Thus, according to the present invention, the semiconductor device can be micronized without lowering the reliability and fabrication yield.

BRIEF DESCRIPTION OF THE DRAWINGS

FIG. 11 is a sectional view of the semiconductor device according to the first embodiment of the present invention in the steps of the method for fabricating the same, which shows the method (Part 1).

FIG. 12 is a plan view of the memory cell region corresponding to the drawing of FIG. 11.

DETAILED DESCRIPTION OF THE INVENTION

[A First Embodiment]

Figure 1:
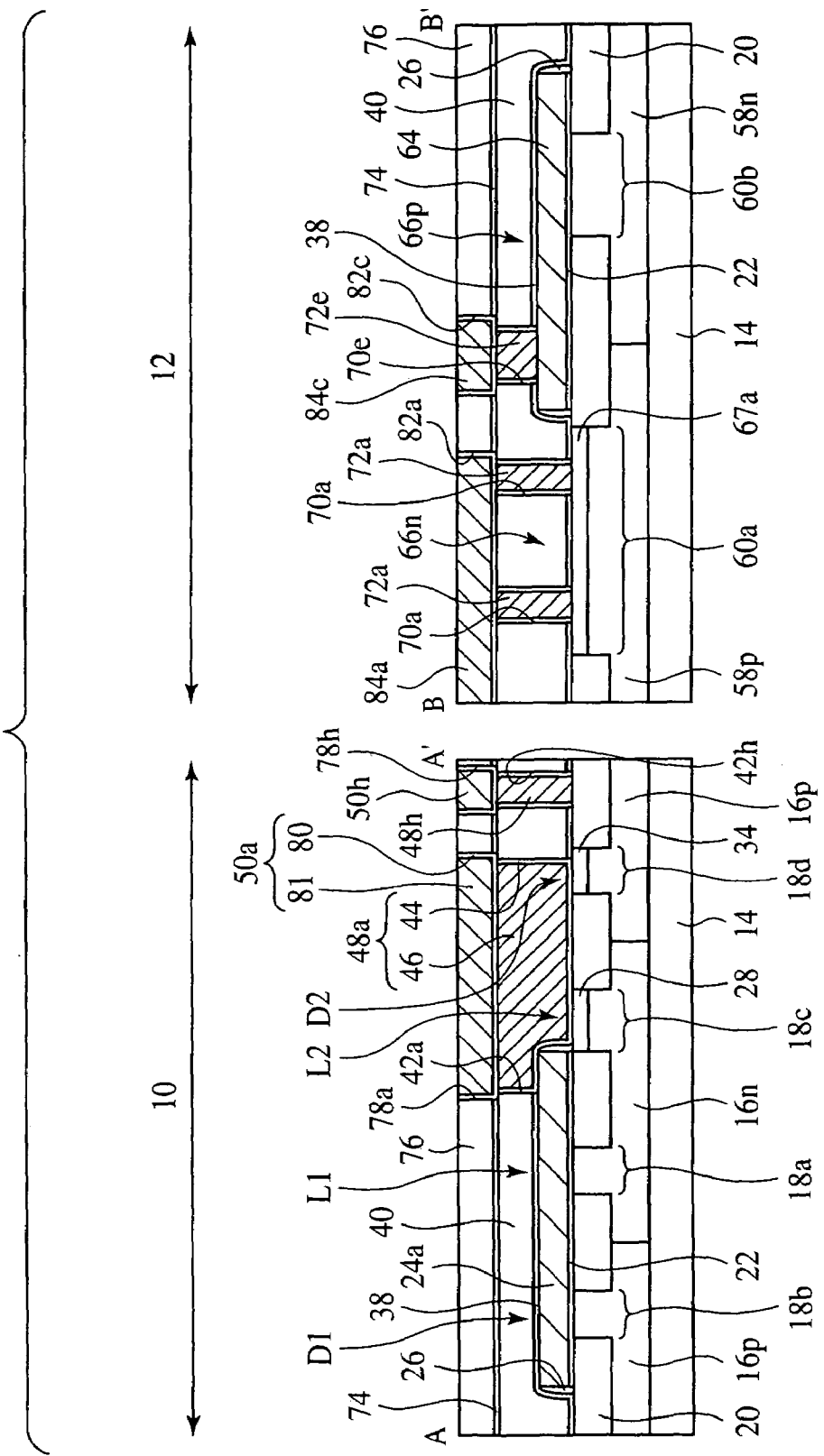
FIG. 1 is a sectional view of the semiconductor device according to a first embodiment of the present invention.
Figure 2:
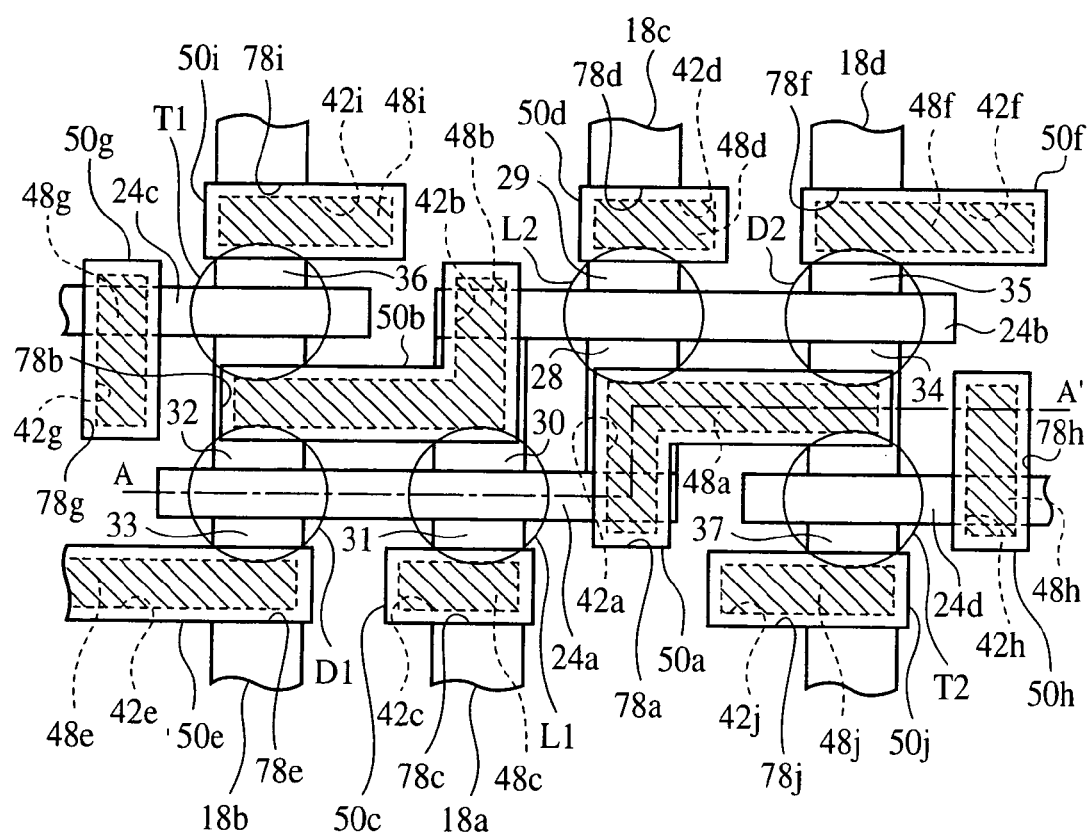
FIG. 2 is a plan view of the memory cell region of the semiconductor device according to the first embodiment of the present invention (Part 1)
Figure 3:
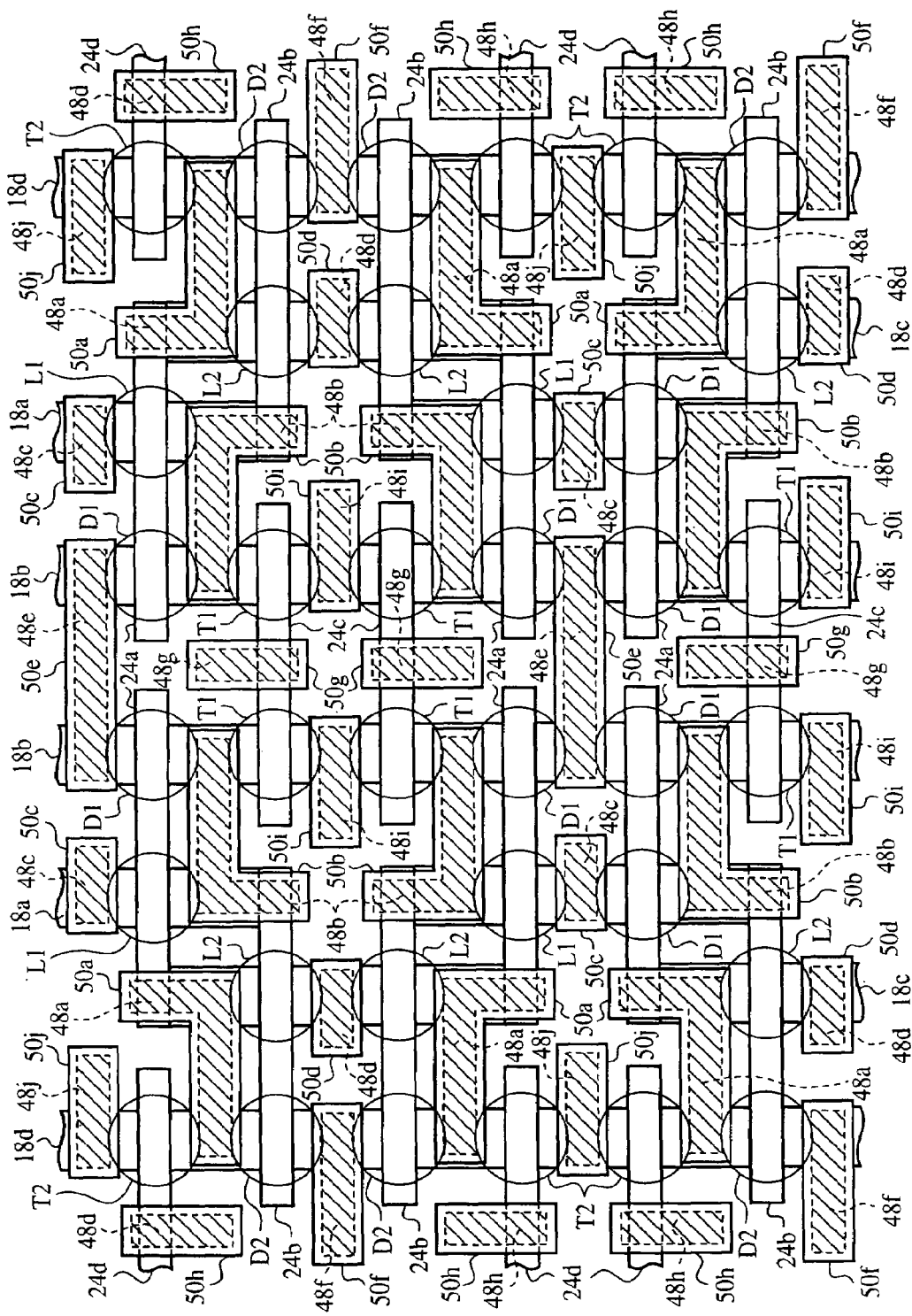
FIG. 3 is a plan view of the memory cell region of the semiconductor device according to the first embodiment of the present invention (Part 2).
Figure 4:
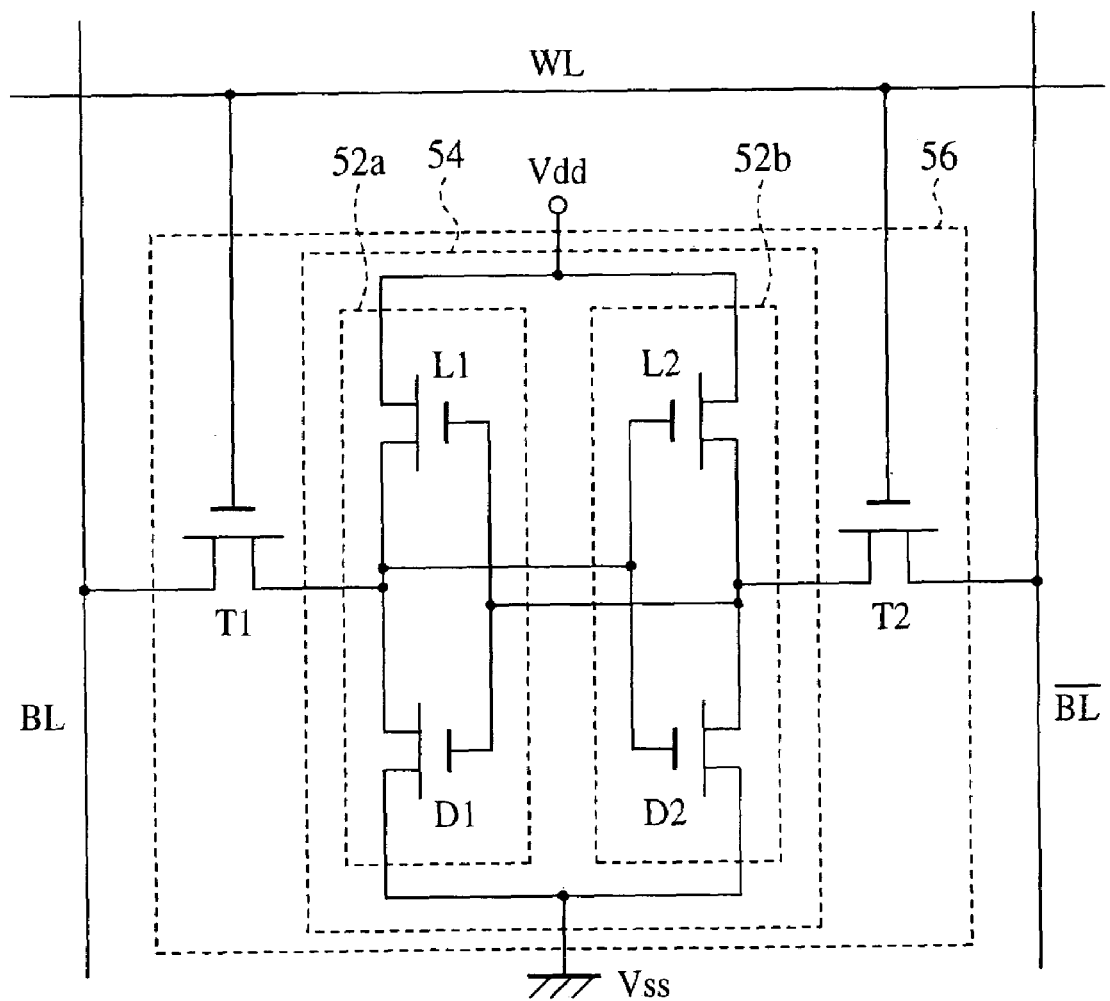
FIG. 4 is a circuit diagram of the semiconductor device according to the first embodiment of the present invention.
Figure 5:
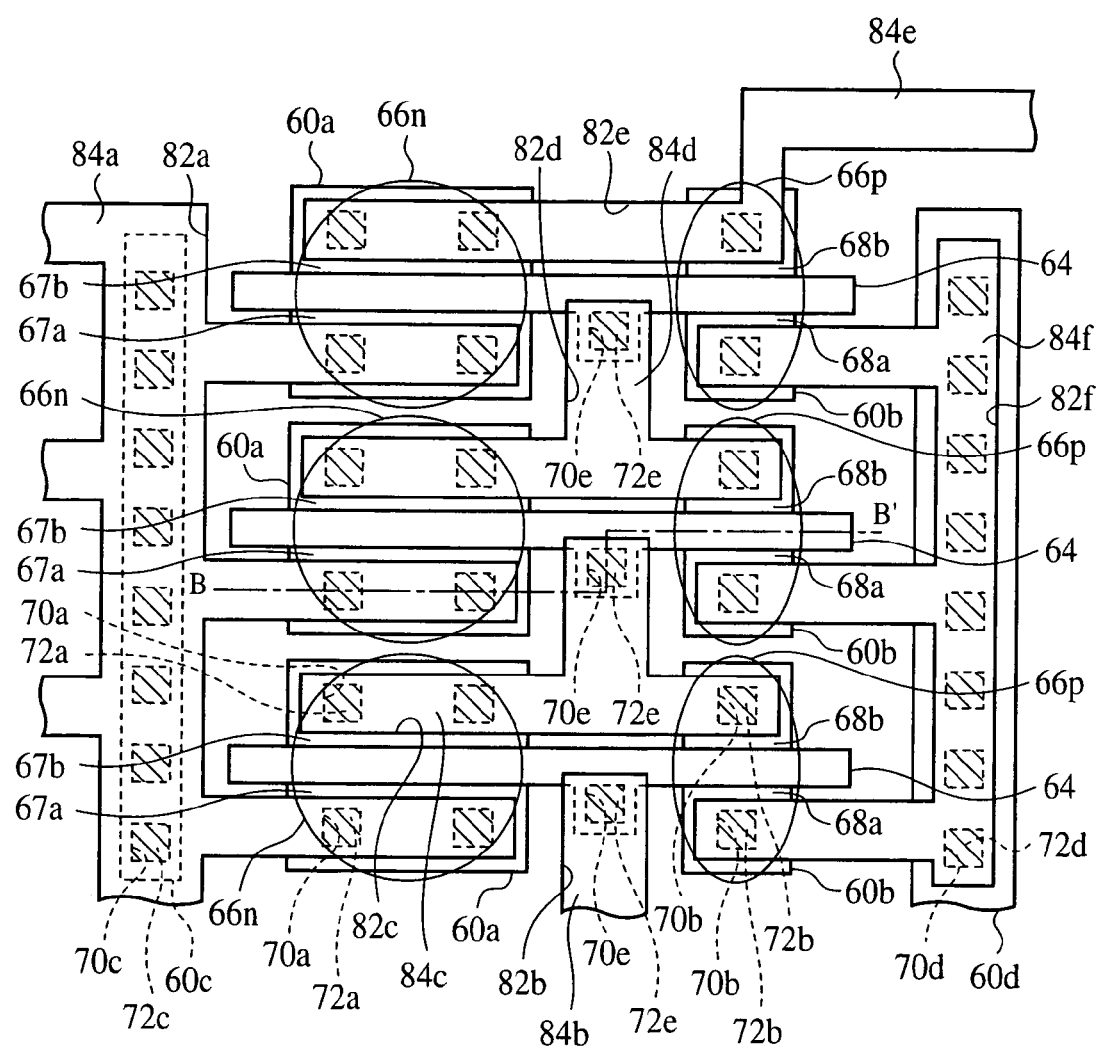
FIG. 5 is a plan view of the peripheral circuit region of the semiconductor device according to the first embodiment of the present invention.

The semiconductor device according to a first embodiment of the present invention and the method for fabricating the semiconductor device will be explained with reference to FIGS. 1 to 22. FIG. 1 is a sectional view of the semiconductor device according to the present embodiment. FIG. 2 is a plan view of the memory cell region of the semiconductor device according to the present embodiment (Part 1). FIG. 3 is a plan view of the memory cell region of the semiconductor device according to the present embodiment (Part 2). FIG. 4 is a circuit diagram of the semiconductor device according to the present embodiment. FIG. 5 is a plan view of the peripheral circuit region of the semiconductor device according to the present embodiment.

(The Semiconductor Device)

The semiconductor device according to the present embodiment will be explained with reference to FIGS. 1 to 5. On the left side of drawing of FIG. 1, a memory cell region 10 for a memory cell to be formed in is shown. On the right side of the drawing of FIG. 1, a peripheral circuit region 12 for a peripheral circuit transistor to be formed in, which is at the periphery of the memory cell region is shown.

First, the memory cell region 10 will be explained.

As shown in FIG. 1, p-type wells 16p and n-type wells 16n are formed on a semiconductor substrate 14 in the memory cell region 10. The semiconductor substrate 14 is, e.g., a p-type silicon substrate.

Device isolation regions 20 for defining device regions 18a–18d are formed on the semiconductor substrate 14 with the p-type wells 16p and the n-type wells 16n formed in.

Gate interconnections 24a–24d (see FIG. 2) are formed on the semiconductor substrate 14 with a gate insulation film 22 formed therebetween. A sidewall insulation film 26 is formed on the side walls of the gate interconnections 24a–24d.

As shown in FIG. 2, the gate interconnection 24a is formed, crossing the device regions 18a, 18b. The gate interconnection 24a includes the gate electrode of a load transistor L1 and the gate electrode of a driver transistor D1 and commonly connects the gate electrode of the load transistor L1 and the gate electrode of the driver transistor D1. The gate interconnection 24a is extended up to the vicinity of source/drain diffused layer 28 of a load transistor L2 formed in the device region 18c.

A source/drain diffused layer 30, 31 is formed in the device region 18a on both sides of the gate interconnection 24a. The gate electrode 24a and the source/drain diffused layer 30, 31 form the load transistor L1.

A source/drain diffused layer 32, 33 is formed in a device region 18b on both sides of the gate interconnection 24a. The gate electrode 24a and the source/drain diffused layer 32, 33 form the driver transistor D1.

The gate interconnection 24b is formed, crossing the device regions 18c, 18d. The gate interconnection 24b includes the gate electrode of a load transistor L2 and a gate electrode of the driver transistor D2 and commonly connects the gate electrode of the load transistor L2 and the gate electrode of the driver transistor D2. The gate interconnection 24b is extended up to the vicinity of the source/drain diffused layer 30 of the load transistor L1.

A source/drain diffused layer 28, 29 are formed in the device region 18c on both sides of the gate interconnection 24b. The gate electrode 24b and the source/drain diffused layer 28, 29 form the load transistor L2.

A source/drain diffused layer 34, 35 is formed in the device region 18d on both sides of the gate interconnection 24b. The gate electrode 24b and the source/drain diffused layer 34, 35 form a driver transistor D2.

The gate interconnection 24c is formed, crossing the device region 18b. The gate interconnection 24c includes the gate electrode of a transfer transistor T1 and commonly connects the gate electrodes of the transfer transistors T1 formed in the memory cells adjacent to each other.

A source/drain diffused layer 32, 36 is formed in the device region 18b on both side of the gate interconnection 24c. The gate electrode 24c and the source/drain diffused layer 32, 36 form the transfer transistor T1.

The gate interconnection 24d is formed, crossing the device region 18d. The gate interconnection 24d includes the gate electrode of a transfer transistor T2 and commonly connects the gate electrodes of the transfer transistors T2 formed in the memory cells adjacent to each other.

A source/drain diffused layer 34, 37 is formed in the device region 18d on both side of the gate electrode 24d. The gate electrode 24d and the source/drain diffused layer 34, 37 form the transfer transistor T2.

A stopper film 38 is formed on the semiconductor substrate 14 with these transistors L1, L2, D1, D2, T1, T2 formed on. An inter-layer insulation film 40 is formed on the semiconductor substrate 14 with the stopper film 38 formed on.

A groove-shaped opening (grooved opening) 42a for integrally exposing the end of the gate interconnection 24a, the source/drain diffused layer 28 of the load transistor L2 and the source/drain diffused layer 34 of the driver transistor D2 is formed in the inter-layer insulation film 40. The width of the groove-shaped opening 42a is, e.g., 90 nm. A contact layer 48a of a barrier film 44 and a tungsten film 46 is buried in the groove-shaped opening 42a.

A groove-shaped opening 42b for integrally exposing the end of the gate interconnection 24b, the source/drain diffused layer 30 of the load transistor L1 and the source/drain diffused layer 32 of the drier transistor D1 is formed in the inter-layer insulation film 40. The width of the groove-shaped opening 42b is, e.g., 90 nm. A contact layer 48b is buried in the groove-shaped opening 42b.

A groove-shaped opening 42c for exposing the source/drain diffused layer 31 of the load transistor L1 is formed in the inter-layer insulation film 40. The groove-shaped opening 42c is extended along the gate interconnection 24a. The width of the groove-shaped opening 42c is, e.g., 90 nm. The length of the groove-shaped opening 42c is, e.g., 180 nm. A contact layer 48 is buried in the groove-shaped opening 42c.

A groove-shaped opening 42d for exposing the source/drain diffused layer 29 of the load transistor L2 is formed in the inter-layer insulation film 40. The groove-shaped opening 42d is extended along the gate interconnection 24b. The width of the groove-shaped opening 42d is the same as that of the groove-shaped opening 42c. The length of the groove-shaped opening 42d is the same as that of the groove-shaped opening 42c. A contact layer 48d is buried in the groove-shaped opening 42d.

A groove-shaped opening 42e for exposing the source/drain diffused layer 33 of the driver transistor D1 is formed in the inter-layer insulation film 40. The groove-shaped opening 42e is extended along the longitudinal direction of the gate interconnection 24a. The groove-shaped opening 42e is formed, connecting the source/drain diffused layers 33 of the driver transistors D1 formed in the memory cells adjacent each other. The width of the groove-shaped opening 42e is, e.g., 90 nm. The length of the groove-shaped opening 42e is, e.g., 530 nm. A contact layer 48e is buried in the groove-shaped opening 42e.

A groove-shaped opening 42f for exposing the source/drain diffused layer 35 of the driver transistor D2 is formed in the inter-layer insulation film 40. The groove-shaped opening 42f is formed along the longitudinal direction of the gate interconnection 24b. The groove-shaped opening 42f is formed, connecting the source/drain diffused layers 35 of the driver transistors D2 formed in the memory cells adjacent each other. The width of the groove-shaped opening 42f is the same as that of the groove-shaped opening 42e. The length of the groove-shaped opening 42f is the same as that of the groove-shaped opening 42e. A contact layer 48f is buried in the groove-shaped opening 42f.

A groove-shaped opening 42g for exposing the gate electrode 24c of the transfer transistor T1 is formed in the inter-layer insulation film 40. The groove-shaped opening 42g is extended perpendicularly to the longitudinal direction of the gate interconnection 24c. A contact layer 48g is buried in the groove-shaped opening 42g.

A groove-shaped opening 42h for exposing the gate electrode 24d of the transfer transistor T2 is formed in the inter-layer insulation film 40. The groove-shaped opening 42h is extended perpendicularly to the longitudinal direction of the gale line 24d. A contact layer 48h is buried in the groove-shaped opening 42h.

A groove-shaped opening 42i for exposing the source/drain diffused layer 36 of the transfer transistor T1 is formed in the inter-layer insulation film 40. The groove-shaped opening 42i is extended along the longitudinal direction of the gate interconnection 24c. The width of the groove-shaped opening 42i is, e.g., 90 nm. The length of the groove-shaped opening 42i is, e.g., 210 nm. A contact layer 48i is buried in the groove-shaped opening 42i.

A groove-shaped opening 42j for exposing the source/drain diffused layer 37 of the transfer transistor T2 is formed in the inter-layer insulation film 40. The groove-shaped opening 42j is extended along the longitudinal direction of the gate interconnection 24d. The width of the groove-shaped opening 42j is the same as that of the groove-shaped opening 42i. The length of the groove-shaped opening 42j is the same as that of the groove-shaped opening 42i. A contact layer 48j is buried in the groove-shaped opening 42j.

A stopper film 74 is formed on the inter-layer insulation film 40 with the contact layer 48a–48j buried in.

An inter-layer insulation film 76 is formed on the stopper film 74.

Groove-shaped openings 78a–78j for exposing the contact layer 48a–48j are formed in the inter-layer insulation film 76. The groove-shaped openings 78a–78j are formed along the contact layer 48a–48j.

Interconnections 50a–50j of a barrier film 80 and a Cu film 81 are buried in the groove-shaped openings 78a–78j.

The interconnections 50c, 50d formed on the contact layer 48c, 48d are electrically connected to a source voltage Vdd (see FIG. 4)

The interconnections 50e, 50f formed on the contact layer 48e, 48f are electrically connected to an earth voltage Vss (see FIG. 4).

The interconnections 50g, 50h formed on the contact layer 48g, 48h are electrically connected to a word line WL (see FIG. 4).

The interconnections 50i, 50j formed on the contact layer 48i, 48j are electrically connected to a bit line BL (see FIG. 4).

FIG. 4 is a circuit diagram of the memory cell of the semiconductor device according to the present embodiment.

As shown in FIG. 4, the load transistor L1 and the driver transistor D1 form an inverter 52a. The load transistor L2 and the driver transistor D2 form an inverter 52b. The inverter 52a and the inverter 52b form a flip-flop circuit 54. The flip-flop circuit 54 is controlled by the transfer transistors T1, T2 connected to the bit lines BL and the word line WL. The load transistors L1, L2, the driver transistors D1, D2, and the transfer transistors T1, T2 form the memory cell 56.

On the other hand, p-type wells 58p and n-type wells 58n are formed in the semiconductor substrate 14 in the peripheral circuit region. Device isolation regions 20 for defining device regions 60a–60d (see FIGS. 1 and 5) are formed on the semiconductor substrate 14 with the p-type wells 58p and the n-type wells 58n formed on.

Gate interconnections are formed on the semiconductor substrate 14 with a gate insulation film 22 formed therebetween. Each gate interconnection 64 includes the gate electrode of the n-channel transistor 66n and the gate electrode of the p-channel transistor 66p and commonly connect the gate electrode of the n-channel transistor 66n and the gate electrode of the p-channel transistor 66p. A sidewall insulation film 26 is formed on the side walls of the gate interconnections 64.

Source/drain diffused layers 67a, 67b are formed in the device regions 60a on both sides of each gate electrode 64. The gate electrode 64, the source/drain diffused layer 67a, 67b form the n-channel transistor 66n.

Source/drain diffused layer 68a, 68b are formed in the device regions 60b on both sides of each gate electrode 64. The gate electrode 64 and the source/drain diffused layers 68a, 68b form the p-channel transistor 66p.

A stopper film 38 is formed on the semiconductor substrate 14 with the n-channel transistors 66n and the p-channel transistors 66p formed on. An inter-layer insulation film 40 is formed on the semiconductor substrate 14 with the stopper film 38 formed on.

Contact holes (openings) 70a are formed in the inter-layer insulation film 40 down to the source/drain diffused layer 67a, 67b of the n-channel transistors 66n. The contact holes 70a are formed at two couples of positions respectively for the source/drain diffused layer 67a, 67b of each n-channel transistor 66n. The diameter of the contact holes 70a is, e.g., 100 nm×100 nm.

Contact holes 70b are formed in the inter-layer insulation film 40 down to the source/drain diffused layer 68a, 68b of the p-channel transistors 66p. The contact holes 70b are formed at one position respectively for the source/drain diffused layer 68a, 68b of each p-channel transistor 66p.

A number of contact holes 70c, 70d are formed in the inter-layer insulation film 40 respectively down to the device regions 60c, 60d.

Contact holes 70e are formed in the inter-layer insulation film 40 down to the gate interconnection 64.

Conductor plugs (contact layers) 72a–72e of a barrier film 44 and a tungsten film 46 are buried respectively in the contact holes 70a–70e.

A stopper film 74 is formed on the inter-layer insulation film 40 with the conductor plugs 72a–72 buried in.

An inter-layer insulation film 76 is formed on the stopper film 74.

Groove-shaped openings 82a–82f for exposing the conductor plugs 72a–72e are formed in the inter-layer insulation film 76.

Interconnections 84a–84f of a barrier film 80 and a Cu film 81 are buried in the groove-shaped openings 82a–82f.

The interconnection 84a is electrically connected to the device region 60c through the conductor plugs 72c. The interconnection 84a is electrically connected to the source/drain diffused layer 67a of the n-channel transistors 66n through the conductor plugs 72a. The interconnection 84a is electrically connected to the earth voltage.

The interconnections 84b–84d are electrically connected to the respective gate interconnections 64 through the conductor plugs 72e. The interconnections 84c–84d are electrically connected respectively to the n-channel transistors 66n through the conductor plugs 72a. The interconnections 84c–84d are electrically connected respectively to the source/drain diffused layer 68b of the p-channel transistors 66p through the conductor plugs 72b.

The interconnection 84e is electrically connected to the source/drain diffused layer 67b of the n-channel transistor 66n through the conductor plugs 72a. The interconnection 84e is electrically connected to the source/drain diffused layer 68b of the p-channel transistor 66p through the conductor plugs 72b.

The interconnection 84f is electrically connected to the device region 60d through the conductor plugs 72d. The interconnection 84f is electrically connected to the source/drain diffused layer 68a of the p-channel transistors 66p through the conductor plugs 72b. The interconnection 84f is electrically connected to a power source voltage.

Thus, in the peripheral circuit region 12, the CMOS circuit including the n-channel transistors 66n and the p-channel transistors 66p is formed.

One major characteristic of the semiconductor device according to the present embodiment is that the gate interconnection 24a, the source/drain diffused layer 28 of the load transistor L2 and the source/drain diffused layer 34 of the driver transistor D2 are connected by the contact layer 48a buried in the groove-shaped opening 42a, and the gate interconnection 24b, the source/drain diffused layer 30 of the load transistor L1 and the source/drain diffused layer 32 of the driver transistor D1 are connected by contact layer 48b buried in the groove-shaped opening 42b.

In the proposed semiconductor device, the conductor plug 148a arriving at the gate interconnection 124a and the source/drain diffused layer 128, and the conductor plug 148 arriving at the source/drain diffused layer 134 are buried in the inter-layer insulation film 140, and the interconnection 150 electrically connecting these conductor plugs 148, 148a is formed on the inter-layer insulation film 140, whereby the gate interconnection 124a, the source/drain diffused layer 128 and the source/drain diffused layer 134 are electrically connected. The conductor plugs 148b arriving at the gate interconnections 124b and the source/drain diffused layer 130, and the conductor plug 148 arriving at the source/drain diffused layer 132 are buried in the inter-layer insulation films 140, and the interconnection 150 electrically connecting these conduction plugs 148, 148b is formed on the inter-layer insulation film 140, whereby the gate interconnections 124b, the source/drain diffused layer 130 and the source/drain diffused layer 132 are electrically connected. In the proposed semiconductor device it is difficult to form the contact holes 142 without failure as the contact holes 142 are increasingly micronized, and resultantly, the reliability and the yields are decreased.

However, according to the present embodiment, the contact layer 48a is buried in the groove-shaped opening 42a which integrally exposes the gate interconnection 24a, the source/drain diffused layer 28 of the load transistor L2, the source/drain diffused layer 34 of the driver transistor D2, and the contact layer 48a electrically connects the gate interconnection 24a, the source/drain diffused layer 28 of the load transistor L2, the source/drain diffused layer 34 of the driver transistor D2. The contact layer 48b is buried in the groove-shaped opening 42b which exposes the gate interconnection 24b, the source/drain diffused layer 30 of the load transistor L1 and the source/drain diffused layer 32 of the driver transistor D1, and the contact layer 48b electrically connect the gate interconnection 24b, the source/drain diffused layer 30 of the load transistor L1 and the source/drain diffused layer 32 of the driver transistor D1. In the present embodiment, the openings 42a, 42b for the contact layer 48a, 48b buried in are groove-shaped, and the pattern occupation ratio of the patterns by the openings 42a, 42b can be higher in comparison with that of patterns of hole-shaped contact holes having small length and breadth diameters. This permits oblique incidence illumination, which is suitable for high pattern occupation ratio cases, to be used in exposing the patterns, and the advantage of the oblique incidence illumination can be sufficiently exerted. According to the present embodiment, the groove-shaped openings 42a, 42b for the contact layer 48a, 48b to be buried in can be formed without failure. The semiconductor device according to the present embodiment can be fabricated without the reliability decrease and the yield decrease even when further micronized.

Another major characteristic of the semiconductor device according to the present embodiment is that the contact layer 48c–48j is buried in the groove-shaped openings 42c–42j for exposing the source/drain diffused layer 31, 29 of the load transistors L1, L2, the source/drain diffused layer 33, 35 of the driver transistors D1, D2, the gate electrodes 24c, 24d of the transfer transistors T1, T2 or the source/drain diffused layer 36, 37 of the transfer transistors T1, T2.

The openings 42c–42j for burying the contact layer 48c–48j are groove-shaped, and can be formed without failure even micronized. The semiconductor device according to the present embodiment can be fabricated without the reliability decrease and the yield decrease even when further micronized.

Furthermore, in the memory cell region 10, the contact layer 48a–48j is buried in the groove-shaped openings 42a–42j, and in the peripheral circuit region 12, the contact layer 72a–72e is buried in the usual contact holes 70a–70e having equal length and breadth diameters, whereby high density can be realized in the memory cell region 10, and in the peripheral circuit region 12, high speed can be realized.

(The Result of the Evaluation)

The result of the evaluation of the semiconductor device according to the present embodiment will be explained with reference to FIGS. 6A to 10B.

Figure 6A:
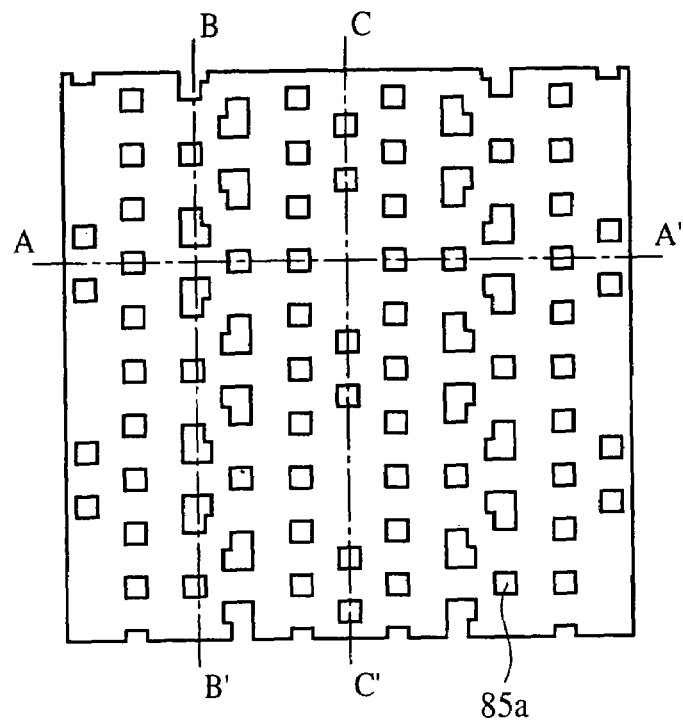
FIG. 6A is a plan view of a mask pattern used in forming contact holes in the inter-layer insulation film.
Figure 6B:
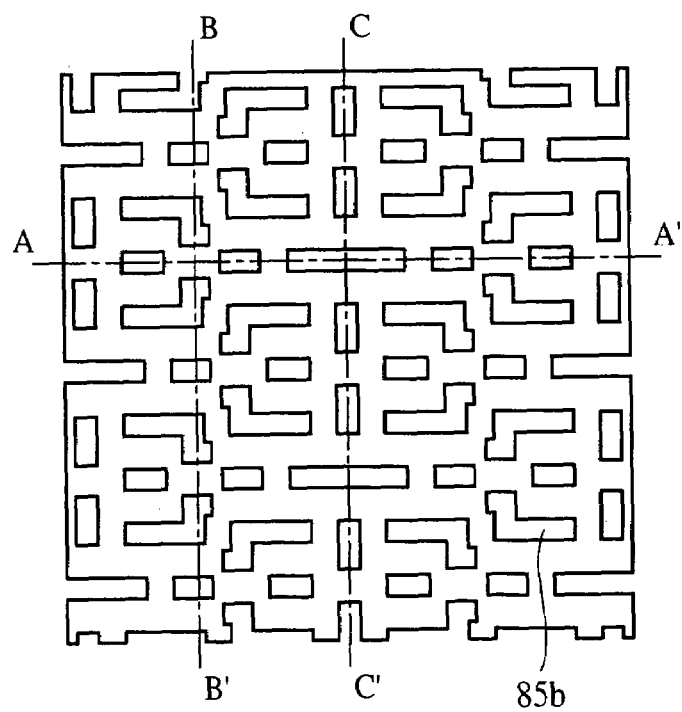
FIG. 6B is a plan view of a mask pattern used in forming groove-shaped openings in the inter-layer insulation film.
Figure 7A:
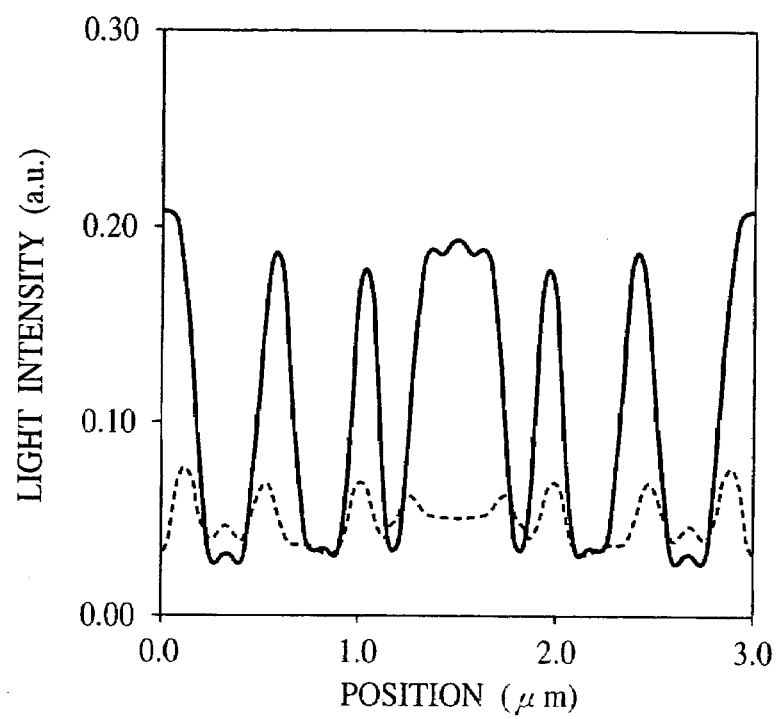
FIGS. 7A and 7B are views of the simulation result of the light intensity (Part 1).
Figure 7B:
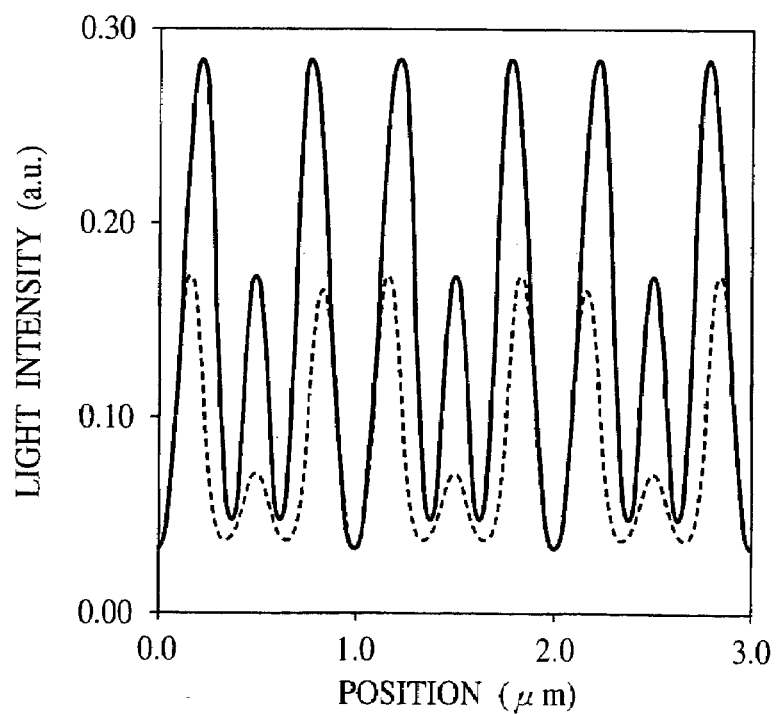
Figure 8:
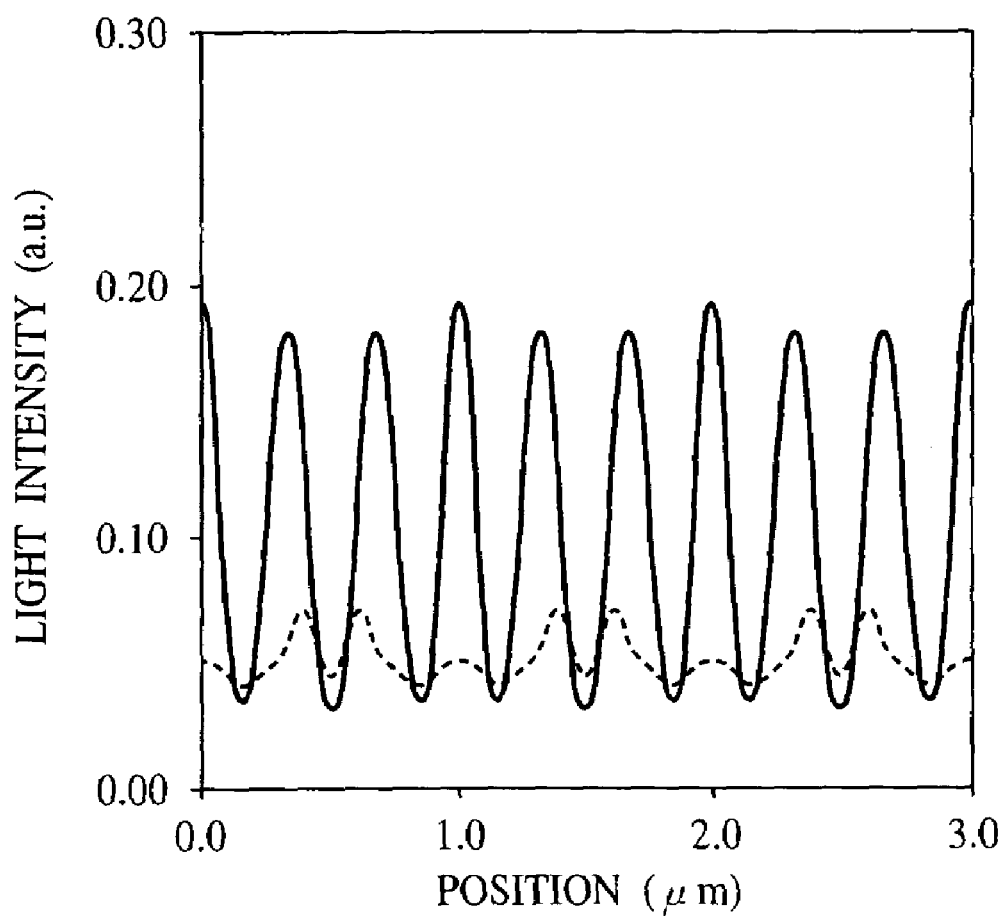
FIG. 8 is a view of the simulation result of the light intensity (Part 2).

FIGS. 6A and 6B are plan views of the mask patterns used in forming contact holes or groove-shaped openings in an inter-layer insulation film. FIG. 6A is a plan view of the mask pattern used in fabricating the proposed semiconductor device. As shown in FIG. 6A, patterns 85a for forming the contact holes are formed. FIG. 6B is a plan view of the mask pattern used in fabricating the semiconductor device according to the present embodiment. As shown in FIG. 6B, patterns 85a for forming the groove-shaped openings are formed. FIG. 7A shows the results of simulating light intensities at lines A–A'. FIG. 7B is the result of simulating light intensities at line B–B'. FIG. 8 shows the result of simulating light intensities at line C–C'. In FIGS. 7A to 8, the solid lines indicate the semiconductor device according to the present embodiment, and the broken lines indicate the proposed semiconductor device. In FIGS. 7A to 8, positions are taken on the horizontal axis, and light intensities are taken on the vertical axis. In the simulation, a light intensity simulator of scalar model was used. Conditions for the simulation were as follow. The number of apertures NA was 0.75. The lighting was 2/3 zonal lighting. The σ value was 0.567/0.850.

As seen from FIGS. 7A to 8, in the proposed semiconductor device, the light intensity is low, and contrast sufficient enough to separate the patterns without failure was not obtained.

In the semiconductor device according to the present embodiment, contrasts good enough to separate the patterns without failure were obtained.

Based on the above, it is found that according to the present embodiment, the openings for the contact layer to be buried in can be formed without failure even micronized, and the semiconductor device can have high reliability.

Figure 9A:
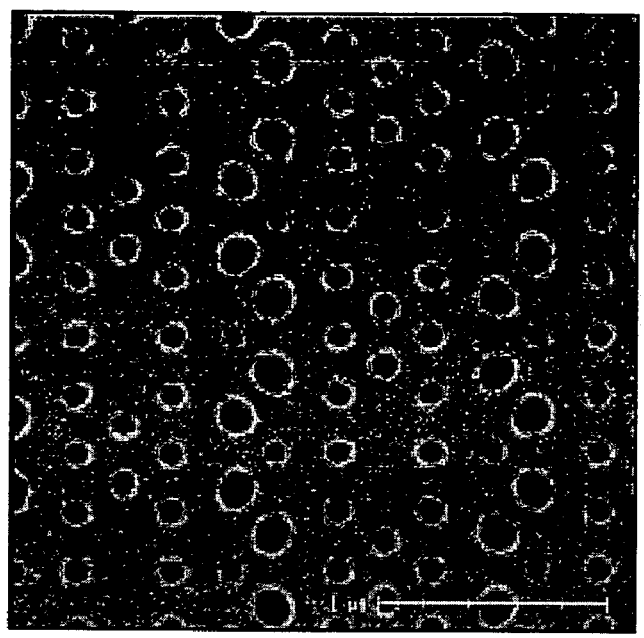
FIGS. 9A and 9B are plan views of electronic microscopic pictures of the proposed semiconductor device.
Figure 9B:
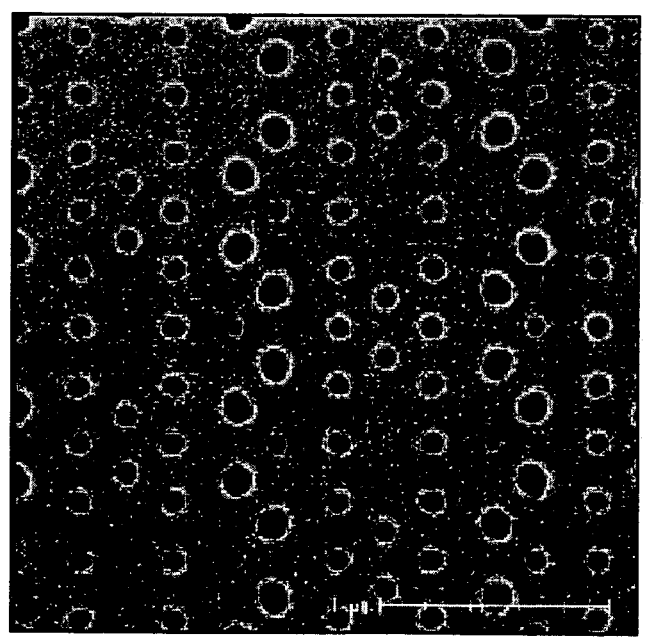
Figure 10A:
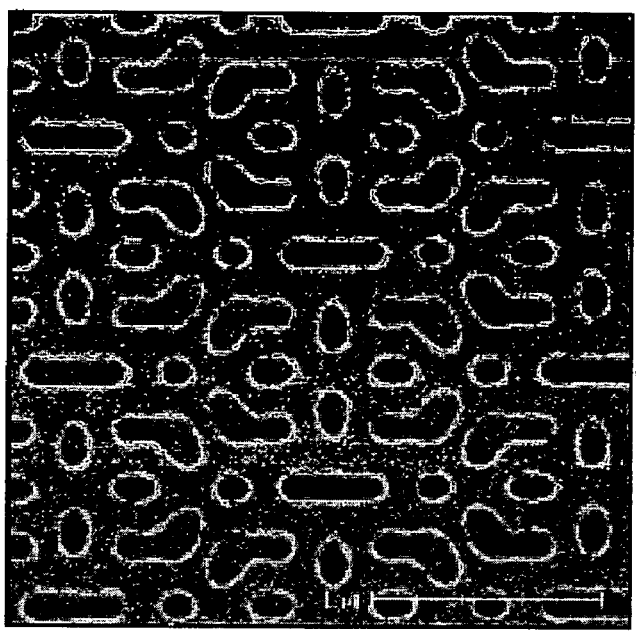
FIGS. 10A and 10B are plan views of electronic microscopic pictures of the semiconductor device according to first embodiment of the present invention.
Figure 10B:
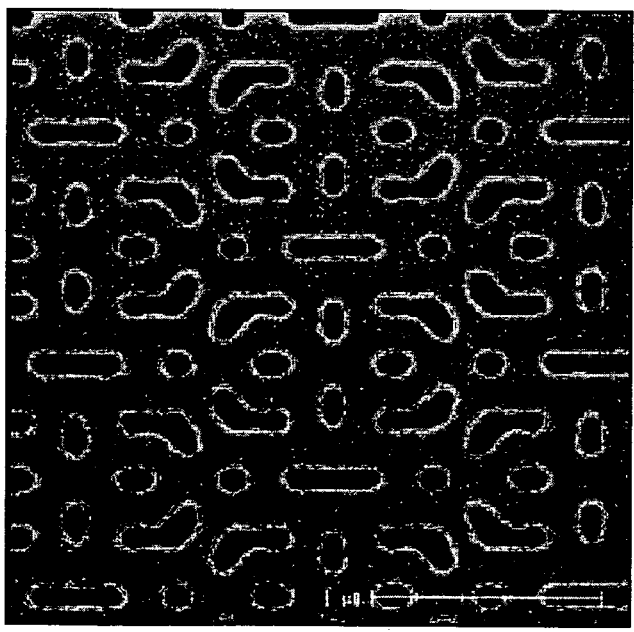

FIGS. 9A and 9B are plan views of electron microscopic pictures of the proposed semiconductor device. FIG. 9A shows openings for forming the contact holes are formed in a photoresist film. FIG. 9B shows the contact holes formed in an inter-layer insulation film by etching the inter-layer insulation film with the photoresist film as the mask. FIGS. 10A and 10B are plan views of electron microscopic pictures of the semiconductor device according to the present embodiment. FIG. 10A shows a photoresist film with the openings for forming the groove-shaped openings formed in. FIG. 10B is an inter-layer insulation film with the groove-shaped openings formed in by etching the inter-layer insulation film with the photoresist film as the mask.

As seen in FIG. 9B, in the proposed semiconductor device, the diameters of the contact holes are largely varied, and the process margin is not sufficiently ensured. Furthermore, in the proposed semiconductor device, contact holes of very small diameters are formed, and there is a risk that such openings may not be opened. It is very difficult to bury conductor plugs in the contact holes of such very small diameters. Thus, it is found that the proposed semiconductor device will have the reliability decrease and the yield decrease when the memory cell is micronized.

As seen in FIG. 10B, however, in the semiconductor device according to the present embodiment, the openings are formed stable in grooves, which make it possible to ensure a sufficient process margin. In the semiconductor device according to the present embodiment, the openings have sufficiently large opened areas, which makes it possible to bury the contact layer in the openings. Based on the above, the semiconductor device according to the present embodiment can have high reliability and yields even the memory cell is micronized.

(The Method for Fabricating the Semiconductor Device)

Figure 13:
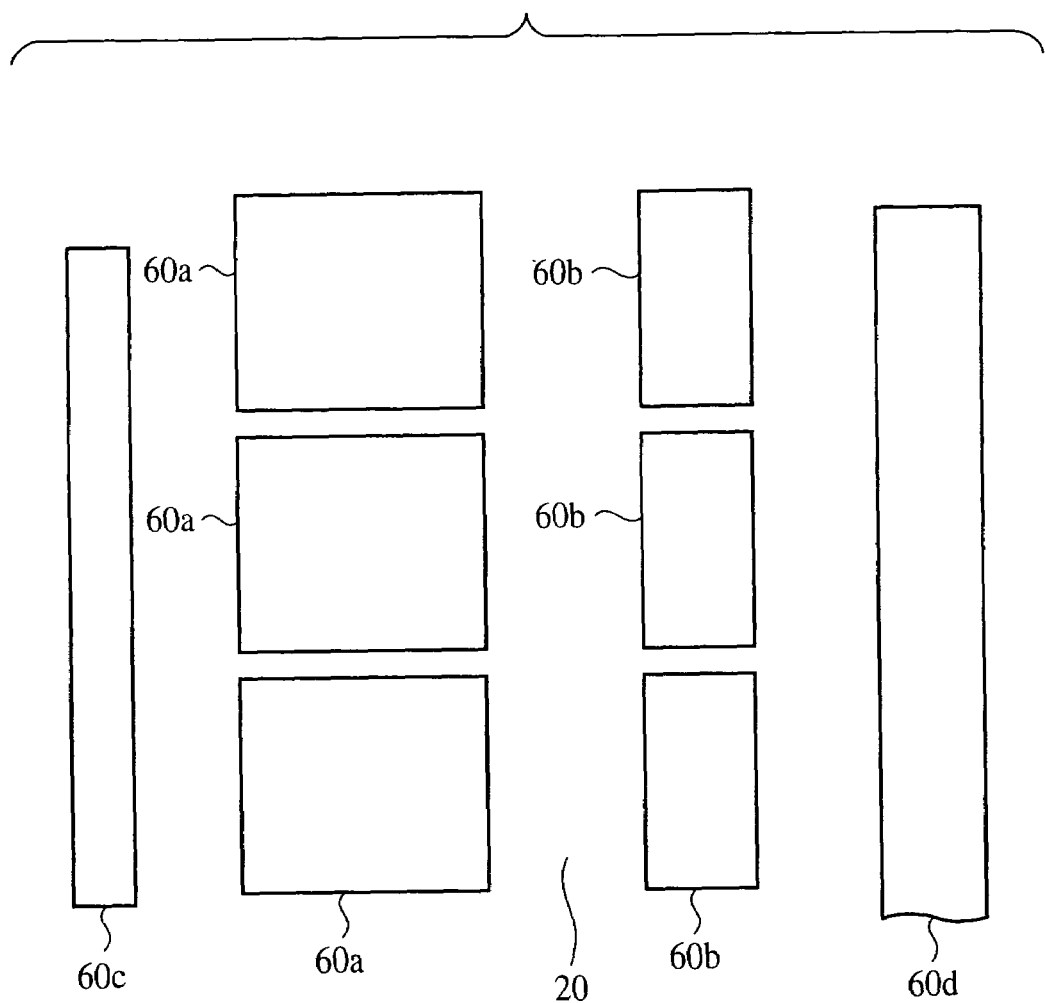
FIG. 13 is a plan view of the peripheral circuit region corresponding to the drawing of FIG. 11.
Figure 14:
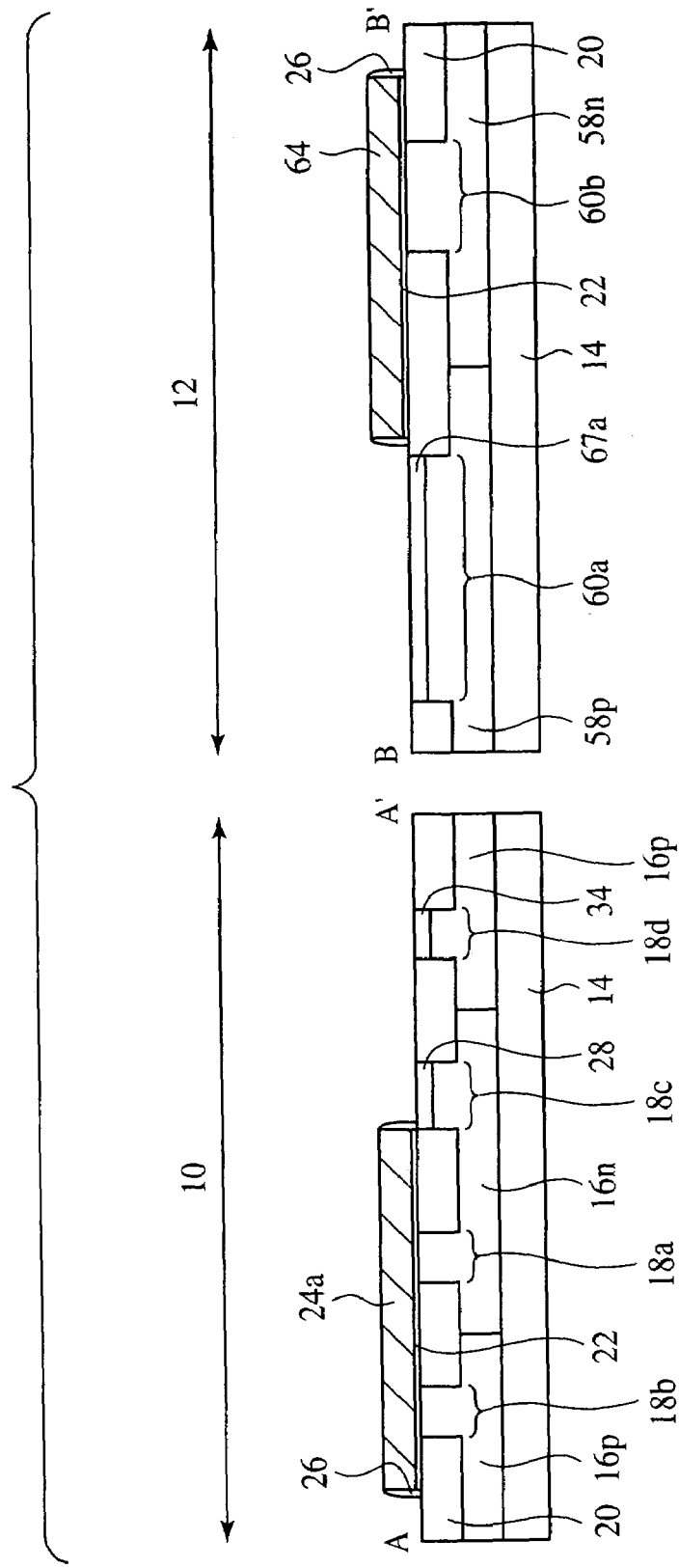
FIG. 14 is a sectional view of the semiconductor device according to the first embodiment of the present invention in the steps of the method for fabricating the same, which shows the method (Part 2).
Figure 15:
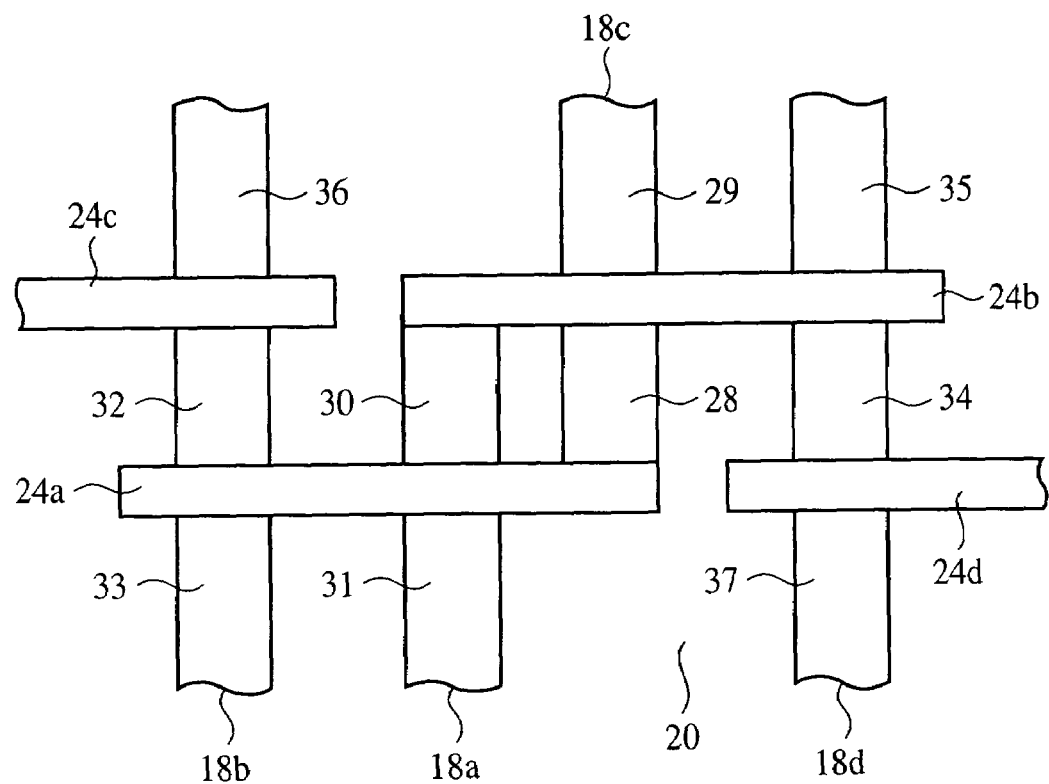
FIG. 15 is a plan view of the memory cell region corresponding to the drawing of FIG. 14.
Figure 16:
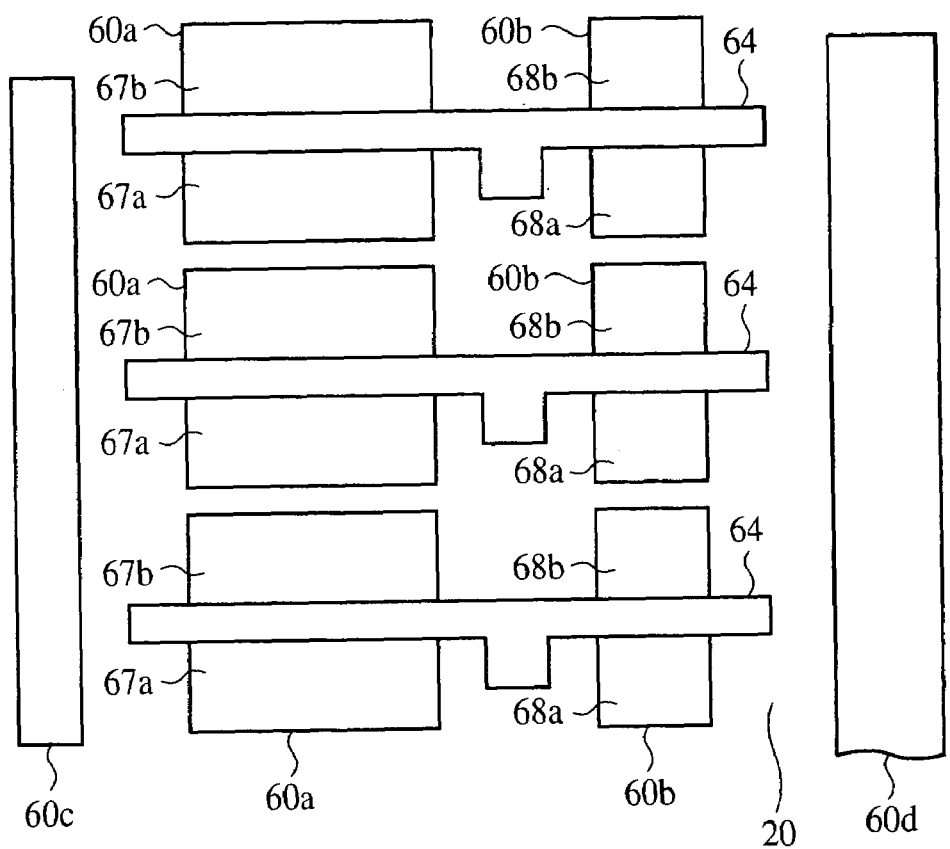
FIG. 16 is a plan view of the peripheral circuit region corresponding to the drawing of FIG. 14.
Figure 17:
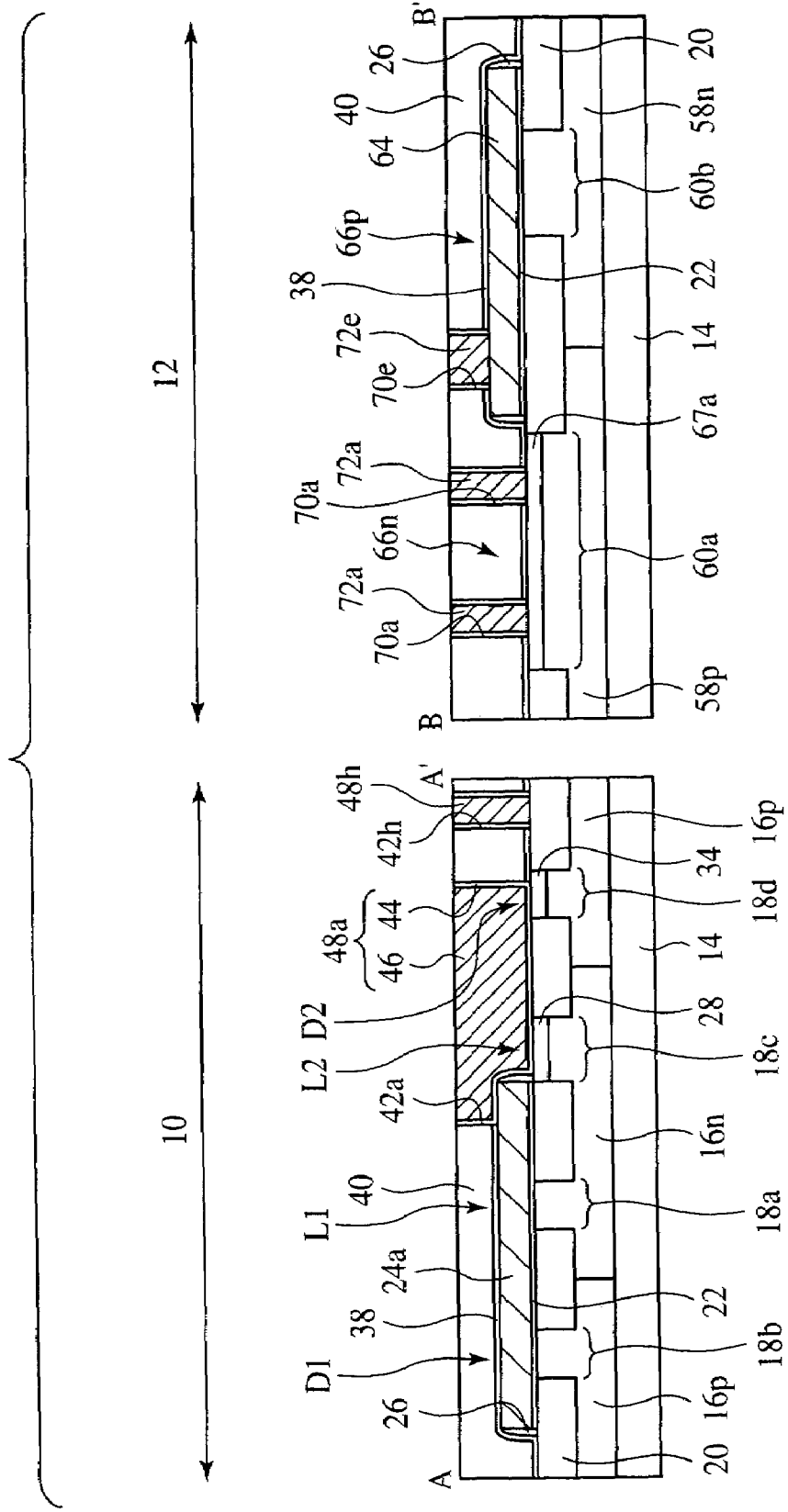
FIG. 17 is a sectional view of the semiconductor device according to the first embodiment of the present invention in the steps of the method for fabricating the same, which shows the method (Part 3).
Figure 18:
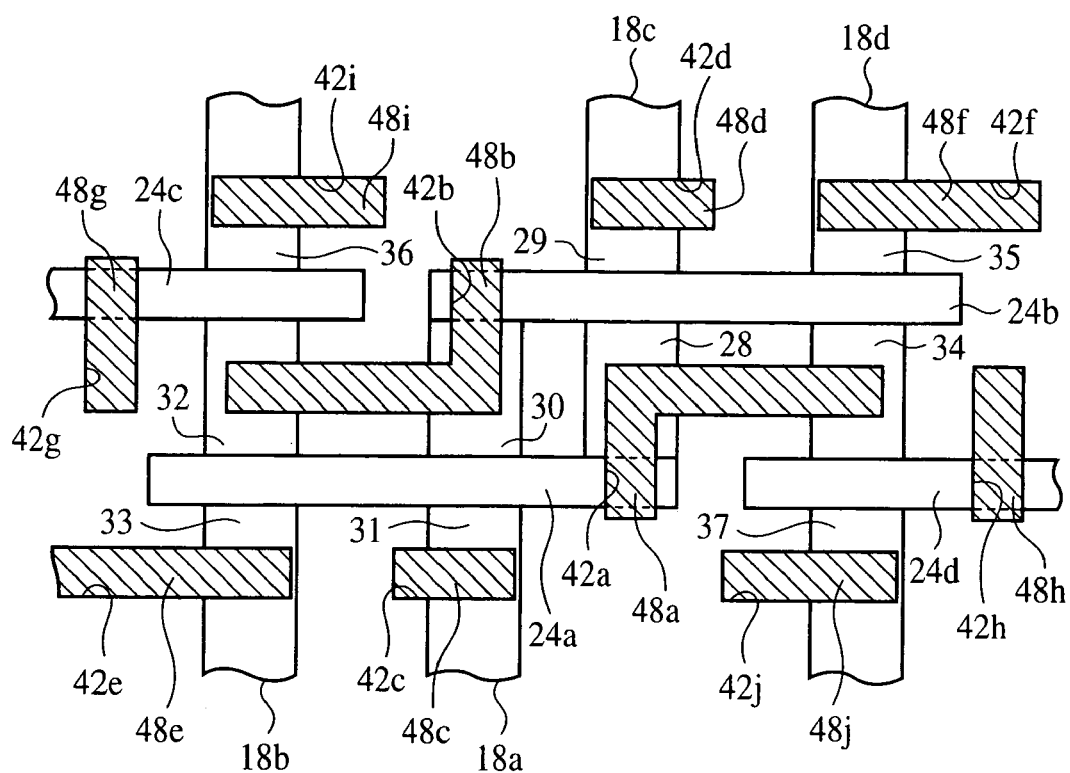
FIG. 18 is a plan view of the memory cell region corresponding to the drawing of FIG. 17.
Figure 19:
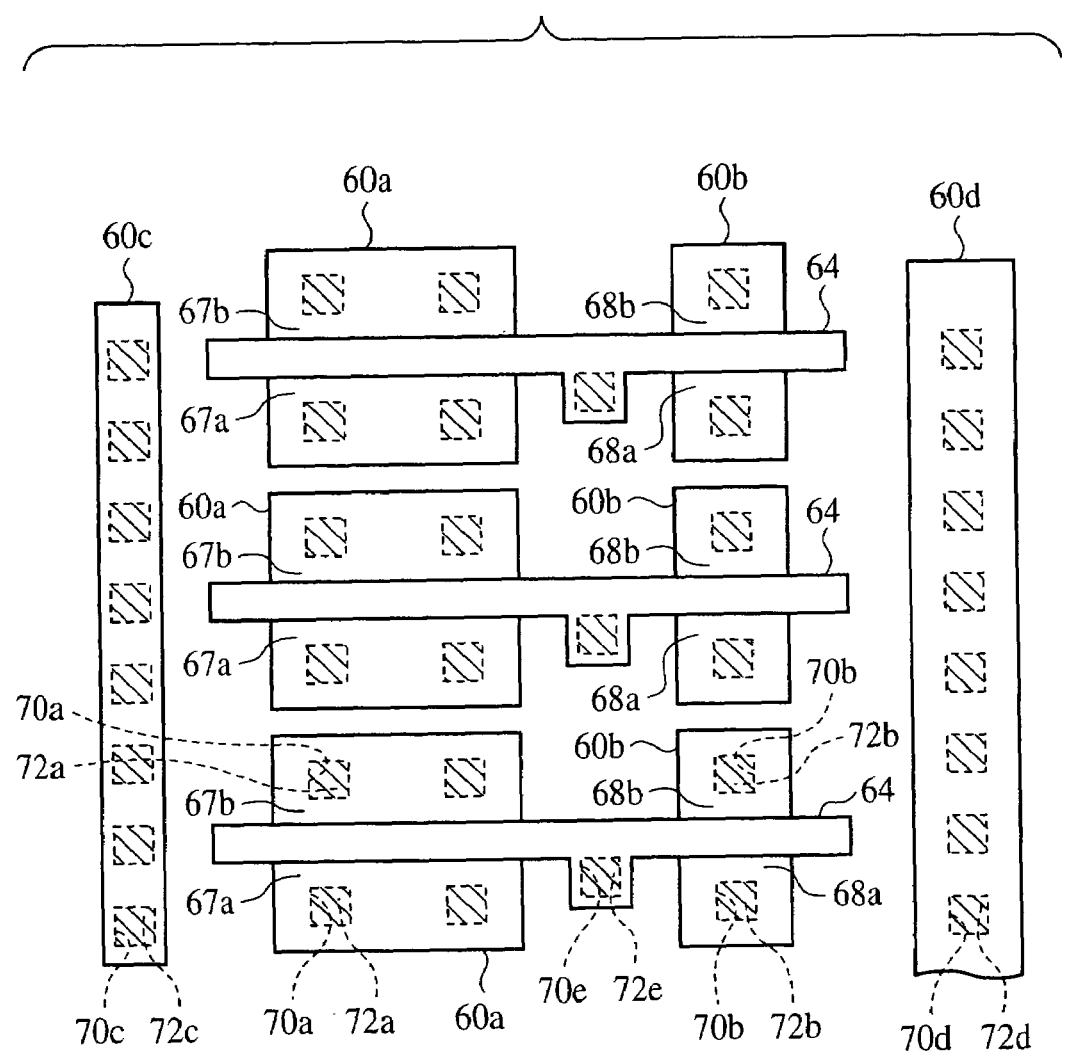
FIG. 19 is a plan view of the peripheral circuit region corresponding to the drawing of FIG. 17.
Figure 20:
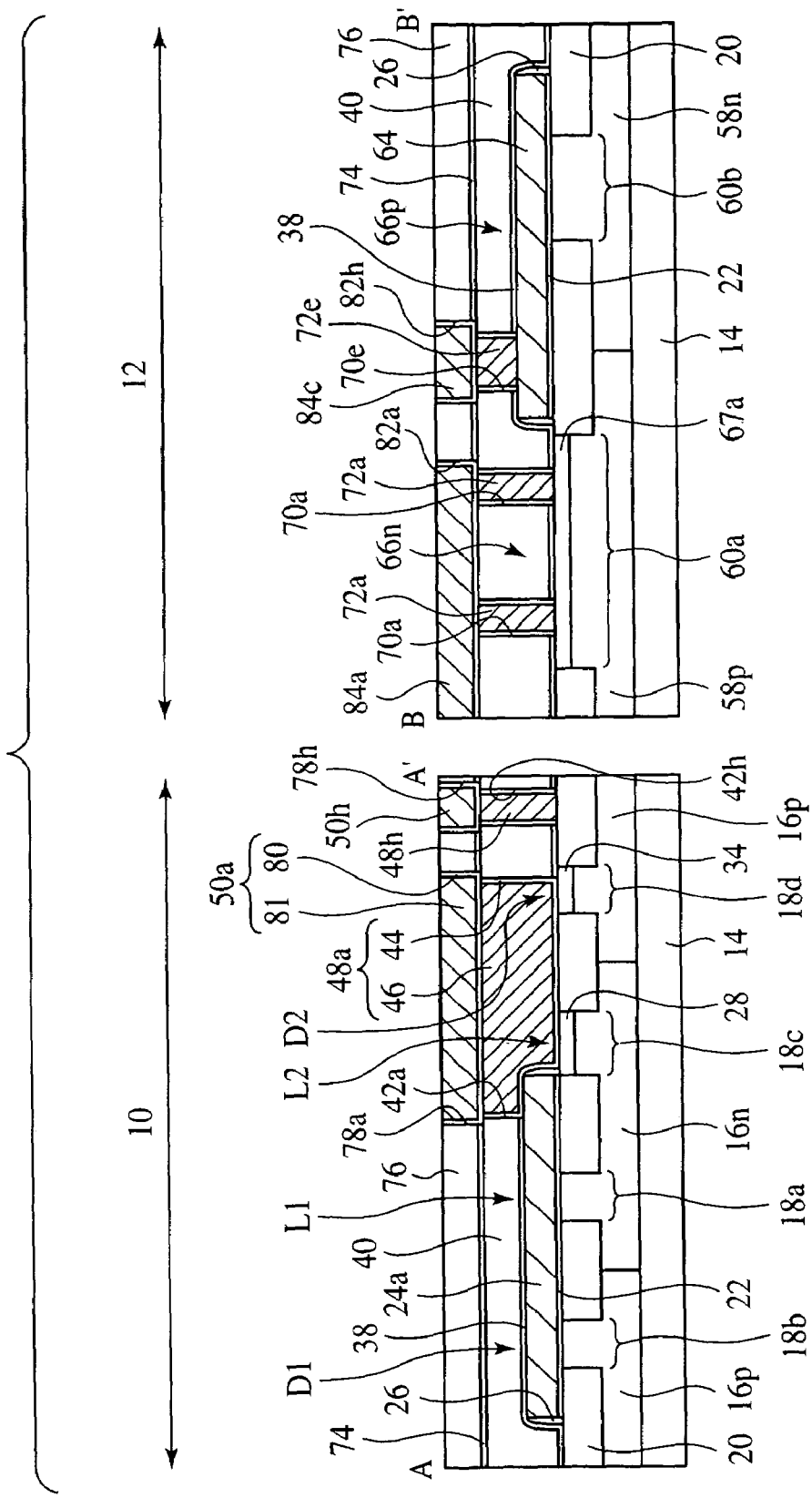
FIG. 20 is a sectional view of the semiconductor device according to the first embodiment of the present invention in the steps of the method for fabricating the same, which shows the method (Part 4).
Figure 21:
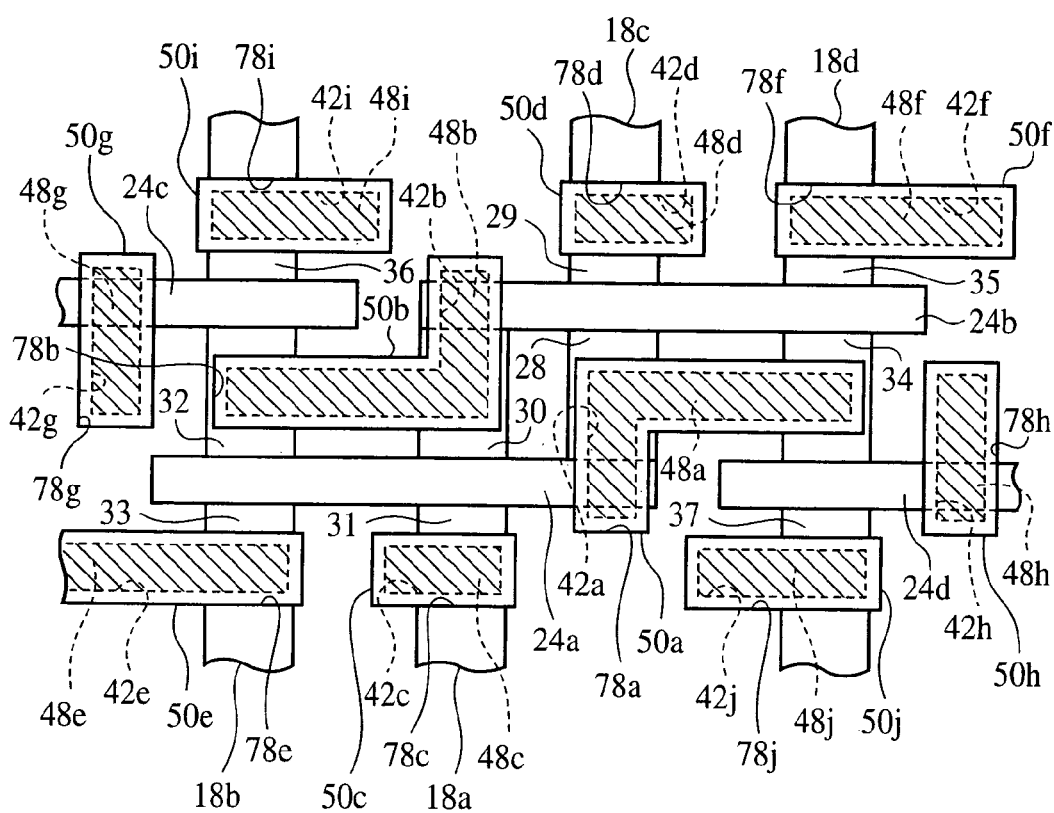
FIG. 21 is a plan view of the memory cell region corresponding to the drawing of FIG. 20.
Figure 22:
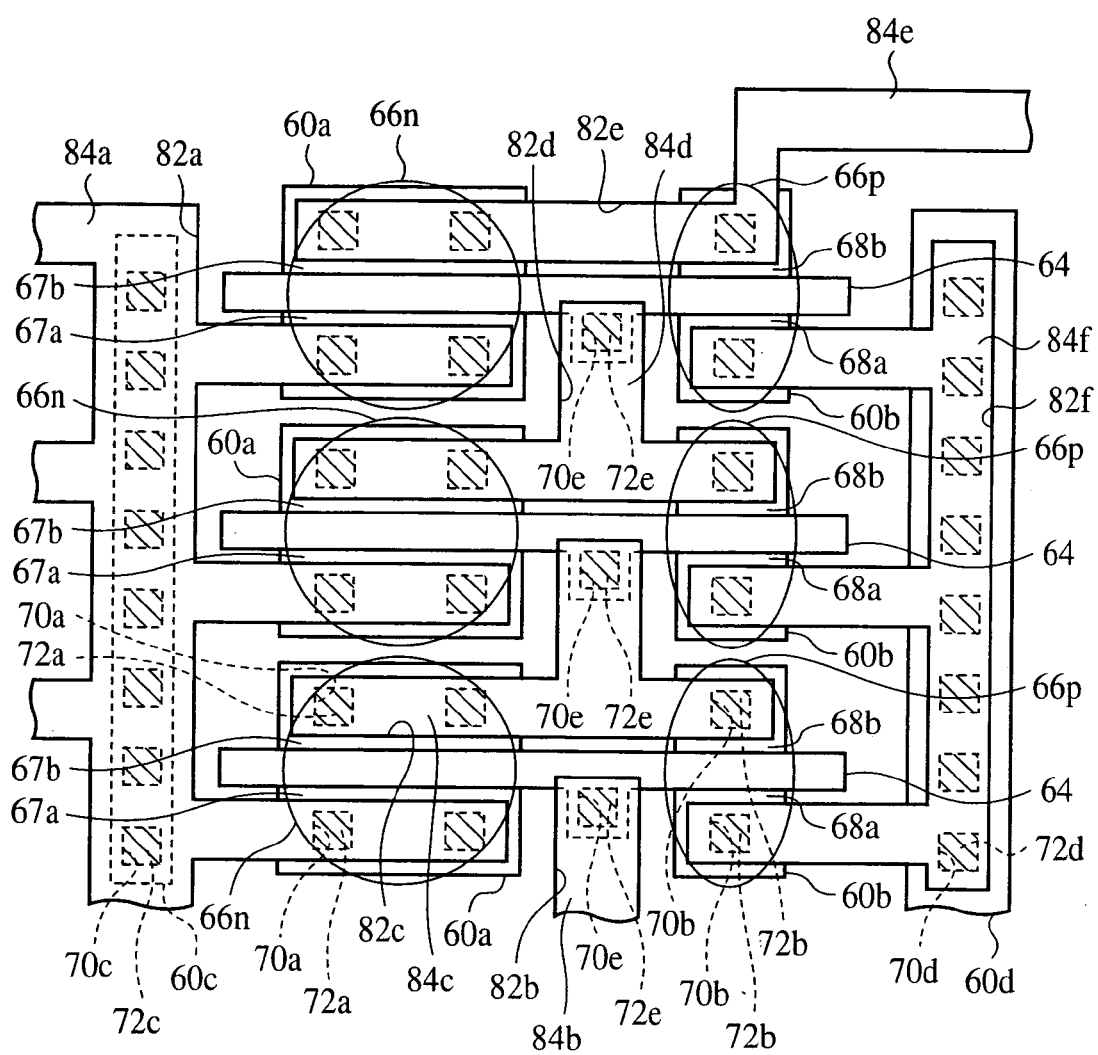
FIG. 22 is a plan view of the peripheral circuit region corresponding to the drawing of FIG. 20.

Then, the method for fabricating the semiconductor device according to the present embodiment will be explained with reference to FIGS. 11 to 22. FIG. 11 is a sectional view of the semiconductor device according to the present embodiment, which show the method for fabricating the semiconductor device (Part 1). FIG. 12 is a plan view of the memory cell region corresponding to the drawing shown in FIG. 11. FIG. 13 is a plan view of the peripheral circuit region corresponding to the drawing shown in FIG. 11. FIG. 14 is a sectional view of the semiconductor device according to the present embodiment, which shows the method for fabricating the semiconductor device (Part 2). FIG. 15 is a plan view of the memory cell region corresponding to the drawing shown in FIG. 14. FIG. 16 is a plan view of the peripheral circuit region corresponding to the drawing shown in FIG. 14. FIG. 17 is a plan view of the semiconductor device according to the present embodiment, which shows the method for fabricating the semiconductor device (Part 3). FIG. 18 is a plan view of the memory cell region corresponding to the drawing shown in FIG. 17. FIG. 19 is a plan view of the peripheral circuit region corresponding to the drawing shown in FIG. 17. FIG. 20 is a plan view of the semiconductor device according to the present embodiment, which shows the method for fabricating the semiconductor device (Part 4). FIG. 21 is a plan view of the memory cell region corresponding to the drawing shown in FIG. 20. FIG. 22 is a plan view of the peripheral circuit region corresponding to the drawing shown in FIG. 20. On the left sides of the drawings of FIGS. 11, 14, 17 and 20, the memory cell region 10 for the memory cell to be formed in is shown. On the right sides of the drawings of FIGS. 11, 14, 17 and 20, the peripheral circuit region 12 at the periphery of the memory cell region, where the peripheral circuit transistors are to be formed is shown.

First, as shown in FIG. 11, the semiconductor substrate 14 is prepared. As the semiconductor substrate 14, a p-type silicon substrate, for example, is used.

Next, a 5 nm-thickness silicon oxide film (not shown) is formed on the entire surface of the semiconductor substrate 14 by, e.g., thermal oxidation.

Then, a 80 nm-thickness silicon nitride film (not shown) is formed on the entire surface by, e.g., CVD. Thus, the layer film (not shown) of the silicon oxide film and the silicon nitride film is formed.

Then, a photoresist film (not shown) is formed on the entire surface by, e.g., spin coating.

Next, the photoresist film is patterned by photolithography.

Then, with the photoresist film as the mask, the layer film is etched. Then, the photoresist film is removed.

Then, with the layer film as the hard mask, the semiconductor substrate 14 is etched. Thus, the grooves 15 are formed in the semiconductor substrate 14. The depth of the grooves 15 is about 300 nm from the surface of the semiconductor substrate 14.

Next, a 450 nm-thickness silicon oxide film is formed on the entire surface by, e.g., high-density plasma-enhanced CVD.

Then, the surface of the silicon oxide film is polished by, e.g., CMP (Chemical Mechanical Polishing) until the surface of the layer film is exposed. The silicon nitride film contained in the layer film functions as the stopper film in the polish. Thus, the device isolation regions 20 of the silicon oxide film are buried in the grooves 15. Thus, the device regions 18a–18d, 60a–60d are defined by the device isolation regions 20 (see FIGS. 12 and 13).

Then, the layer film (not shown) left on the device regions 18, 60 is removed by, e.g., wet etching.

Next, a photoresist film (not shown) is formed on the entire surface by, e.g., spin coating.

Then, openings for exposing the regions for the p-type wells to be formed in is formed in the photoresist film.

Next, with the photoresist film as the mask, a p-type dopant impurity is implanted in the semiconductor substrate 14. Thus, as shown in FIG. 14, the p-type wells 16p, 58p are formed in the semiconductor substrate 14. Then, the photoresist film is removed.

Then, a photoresist film (not shown) is formed on the entire surface by, e.g., spin coating.

Next, openings (not shown) for exposing the regions for the n-type well to be formed in are formed in the photoresist film.

Then, with the photoresist film as the mask, an n-type dopant impurity is implanted in the semiconductor substrate 14. Thus, the n-type wells 16n, 58n are formed in the semiconductor substrate 14. Then, the photoresist film is removed.

Then, a photoresist film is formed on the entire surface by, e.g., spin coating.

Next, openings for exposing the device regions 18a, 18d, 60a are formed in the photoresist film.

Then, with the photoresist film as the mask, a p-type dopant impurity is implanted. Thus, a channel doped layer (not shown) is formed in the device regions 18b, 18d, 60a. The channel doped layer is for controlling the threshold voltage. Then, the photoresist film is removed.

Then, a photoresist film (not shown) is formed on the entire surface by, e.g., spin coating.

Then, openings for exposing the device regions 18a, 18c, 60b are formed in the photoresist film.

Next, with the photoresist film as the mask, an n-type dopant impurity is implanted. Thus, a channel doped layer (not shown) is formed in the device regions 18a, 18c, 60b. Then, the photoresist film is removed.

Then, a 2 nm-thickness gate insulation film 22 is formed by, e.g., thermal oxidation.

Next, a 100 nm-thickness polysilicon film is formed by, e.g., CVD.

Then, the polysilicon film is patterned by photolithography. Thus, the gate interconnections 24a–24d, 64 are formed (see FIGS. 15 and 16).

Next, a photoresist film (not shown) is formed on the entire surface by, e.g., spin coating.

Then, openings for exposing the device regions 18b, 18d, 60a are formed in the photoresist film.

Next, with the photoresist film as the mask, an n-type dopant impurity is implanted by, e.g., ion implantation. The n-type dopant impurity is As (arsenic) Conditions for the ion implantation are, e.g., a 1 keV acceleration voltage and a $1.5 \times 10^{15}$ cm$^{-2}$ dose. Thus, the p-type lightly doped diffused layer (not shown) is formed. Then the photoresist film is removed.

Then, a photoresist film (not shown) is formed on the entire surface by, e.g., spin coating.

Next, openings for exposing the device regions 18a, 18c, 60b are formed in the photoresist film.

Then, with the photoresist film as the mask, a p-type dopant impurity is implanted by, e.g., ion implantation. The p-type dopant impurity is B (boron). Conditions for the ion implantation are, e.g., a 0.3 keV acceleration voltage and a $1.5 \times 10^{15}$ cm$^{-2}$ dose. Thus, the p-type lightly doped diffused layer (not shown) is formed. Then, the photoresist film is removed.

Next, a 50 nm-thickness silicon oxide film is formed on the entire surface by, e.g., CVD.

Then, the silicon oxide film is etched back. Thus, the sidewall insulation film of the silicon oxide film is formed on the side walls of the gate interconnections 24, 64. At this time, the exposed gate insulation film 22 is also etched off.

Then, a photoresist film (not shown) is formed on the entire surface by, e.g., spin coating.

Next, openings (not shown) for exposing the device regions 18b, 18d, 60a are formed in the photoresist film.

Then, an n-type dopant impurity is implanted by, e.g., ion implantation with the photoresist film as the mask. The n-type dopant impurity is P (phosphorus). Conditions for the ion implantation are, e.g., a 8 keV acceleration voltage and a $1.2 \times 10^{16}$ cm$^{-2}$ dose. Thus, the n-type heavily doped diffused layer (not shown) and the n-type gate electrodes are formed. The n-type lightly doped diffused layer and the n-type heavily doped diffused layer form the n-type source/drain diffused layer 32–37. Then, the photoresist film is removed.

A photoresist film (not shown) is formed on the entire surface by, e.g., spin coating.

Then, opening (not shown) for exposing the device regions 18a, 18c, 60b are formed in the photoresist film.

Then, with the photoresist film as the mask, a p-type dopant impurity is implanted by, e.g., ion implantation. The p-type dopant impurity is B (boron). Conditions for the ion implantation are, e.g., a 4 keV acceleration voltage and a $6 \times 10^{15}$ cm$^{-2}$ dose. Thus, the p-type heavily doped diffused layer (not shown) and a p-type gate electrode are formed.

The p-type lightly doped diffused layer and the p-type heavily doped diffused layer form the p-type source/drain diffused layer 28–31. Then, the photoresist film is removed.

Next, spike annealing is performed to activate the dopant impurities. The thermal processing temperature is, e.g., 1000° C.

Then, a 5 nm-thickness cobalt film (not shown) is formed on the entire surface by, e.g., sputtering.

Then, thermal processing is performed to react the Co and the Si. Thus, a silicide film (not shown) of the cobalt silicide is formed on the exposed surface of the source/drain diffused layer 28–37. The silicide film (not shown) of the cobalt silicide is formed on the exposed surfaces of the gate interconnections 24, 64. Then, the cobalt film which has not reacted is removed.

Then, as shown in FIG. 17, the stopper film 38 of a 100 nm-thickness SiN film is formed on the entire surface by, e.g., CVD.

Then, the inter-layer insulation film 40 of a 700 nm-thickness $SiO_2$ film is formed on the entire surface by, e.g., plasma-enhanced CVD Next, the surface of the inter-layer insulation film 40 is polished by, e.g., CMP until the thickness of the inter-layer insulation film 40 is decreased to, e.g., about 400 nm. Thus, the surface of the inter-layer insulation film 40 is planarized.

Then, a 80 nm-thickness anti-reflection film (not shown) is formed on the entire surface by, e.g., spin coating. The anti-reflection film is formed of, e.g., an organic material.

Then, a 250 nm-thickness photoresist film (not shown) is formed on the entire surface by, e.g., spin coating. The photoresist film is, e.g., positive-type ArF excimer resist.

In exposing the photoresist film, zonal lighting, for example, is used. In the zonal lighting, a ring-shaped opening is provided in the diaphragm of the lighting system. Specifically, a 2/3 zonal lighting, for example is used. The σ value is, e.g., 0.567/0.850. The number of apertures NA is, e.g., 0.75. The luminous exposure for exposing the photoresist film is, e.g., about 350 J/cm$^2$.

The reticle used in exposing the photoresist film is a halftone-type phase shift mask for ArF excimer laser lithography. The transmittance t is, e.g., 6%.

Thus, the patterns are exposed in the photoresist film and developed. Thus, openings of an about 90 nm-minimum size are formed in the photoresist film.

In exposing the patterns in the photoresist film, auxiliary patterns (assist patterns, scattering ring bars) may be arrange near the patterns for forming the contact holes 70a–70e. The auxiliary patterns are for forming good patterns when the exposure is performed by using oblique incidence illumination. The patterns for forming the contact holes 70a–70e can be thus formed better.

When the openings formed in the photoresist film are too large, it is possible that an organic film is applied, and thermal processing is performed to adhere the organic film to the inside walls of the openings to thereby make the openings smaller. Such technique is called shrink technique and is described in, e.g., the specification of Japanese Patent Application Unexamined Publication 2003-131400.

Then, with the photoresist film as the mask and with the stopper film 38 as the etching stopper, the inter-layer insulation film 40 is etched. Thus, the groove-shaped openings 42a–42j and the contact holes 70a–70e are formed in the inter-layer insulation film 40.

Then, the stopper film 38 exposed in the groove-shaped openings 42a–42j and the contact holes 70a–70e is removed.

Thus, the groove-shaped openings 42a–42j are formed in the memory cell region 10, and in the peripheral circuit region 12, the contact holes 70a–70e are formed (see FIGS. 18 and 19).

Next, a 10 nm-thickness Ti film and a 50 nm-thickness TiN film are sequentially formed by, e.g., sputtering. Thus, the barrier film 44 of the Ti film and the TiN film is formed.

Then, the tungsten film 46 of a 200 nm-thickness is formed by, e.g., CVD.

Next, the tungsten film 46 and the barrier film 44 are polished by, e.g., CMP until the surface of the inter-layer insulation film 40 is exposed. Thus, the contact layer 48a–48j is buried in the groove-shaped openings 42a–42j. The conductor plugs (the contact layer) 72a–72e are buried in the contact holes 70a–70e.

Next, as shown in FIG. 20, the stopper film 74 of a 30 nm-thickness SiC is formed by, e.g., CVD.

Then, a 200 nm-thickness SiOC film, a 30 nm-thickness SiC film, a 150 nm-thickness silicon oxide film, a 100 nm-thickness silicon nitride film and a 10 nm-thickness silicon oxide film are sequentially formed. Thus, the inter-layer insulation film 76 of the SiOC film, the SiC film, the silicon oxide film, the silicon nitride film and the silicon oxide film is formed.

Then, a 80 nm-thickness anti-reflection film (not shown) is formed on the entire surface by, e.g., spin coating. The anti-reflection film is formed of, e.g., an organic material.

Then, a 250 nm-thickness photoresist film (not shown) is formed on the entire surface by, e.g., spin coating. The photoresist film is, e.g., positive-type ArF excimer resist.

Next, the photoresist film is exposed and developed by photolithography. Conditions for the exposure and development are the same as those for the exposure and development of the photoresist film for forming, e.g., the groove-shaped openings 42a–42j and the contact holes 70a–70e.

Then, with the photoresist film as the mask and with the stopper film 74 as the etching stopper, the inter-layer insulation film 76 is etched. Thus, the groove-shaped openings 78a–78j, 82a–82f for the interconnections 50a–50j, 84a–84f to be buried is formed in the inter-layer insulation film 76 (see FIGS. 21 and 22).

Next, the stopper film 74 exposed in the groove-shaped openings 78a–78j, 82a–82f is etched off.

Then, the barrier film 80 of, e.g., Ta (tantalum) is formed in a 20 nm-thickness on the entire surface by, e.g., sputtering.

Next, the Cu (copper) film 81 of an about 1 μm thickness is formed by, e.g., plating.

Then, the Cu film 81 and the barrier film 80 are polished by, e.g., CMP until the surface of the inter-layer insulation film 76 is exposed. Thus, the interconnections 50a–50j, 84a–84f of the Cu film 81 and the barrier film 80 are buried respectively in the groove-shaped openings 78a–78j, 82a–82f.

In the present embodiment, the gate interconnection 24a, the source/drain diffused layer 28 of the load transistor L2 and the source/drain diffused layer 34 of the driver transistor D2 are connected by the contact layer 48a buried in the inter-layer insulation film 40, and the gate interconnection 24b, the source/drain diffused layer 30 of the load transistor L1 and the source/drain diffused layer 32 of the driver transistor D1 are connected by the contact layer 48b buried in the inter-layer insulation film 40. It is possible to consider that the interconnections 50a, 50b, etc. are not formed on the inter-layer insulation film 40.

However, even in a case that such contact layer 48 is buried in the inter-layer insulation film 40 in the memory cell region 10, it is very important to form the interconnections 50 on the inter-layer insulation film 40 in the memory cell region 10. In the present embodiment, for the following reason, the interconnections 50 are formed on the inter-layer insulation film 40 in the memory cell region 10.

That is, in a tens micrometer square—hundreds micrometer square region, when no pattern is present, the pattern occupation ratio is 10–20% or below, or the pattern occupation ratio is 80% or more, a large step is formed in the substrate surface when the interconnection material is polished by CMP. When the interconnections 84 are formed on the inter-connection layer 40 in the peripheral circuit region 12, and in the memory cell region 10, the interconnections 50 are not formed on the inter-layer insulation film 40, a step is formed in the memory cell region 10. With the step formed in the memory cell region 10, in patterning the upper interconnections in the later steps, the patterns are out of focus when either of the memory cell region 10 and the peripheral circuit region 12 is exposed. Resultantly, it is difficult to form good upper interconnections, which impairs the reliability of the semiconductor device and is a cause for decreased fabrication yields.

In the present embodiment, when the interconnection material is polished by CMP to form the interconnections 50 on the inter-layer insulation film 40 in the memory region 10, the formation of a large step on the substrate surface can be prevented. Accordingly, the present embodiment can fabricate the semiconductor device of high reliability with high production yields.

Thus, the semiconductor device according to the present embodiment is fabricated.

[A Second Embodiment]

Figure 23:
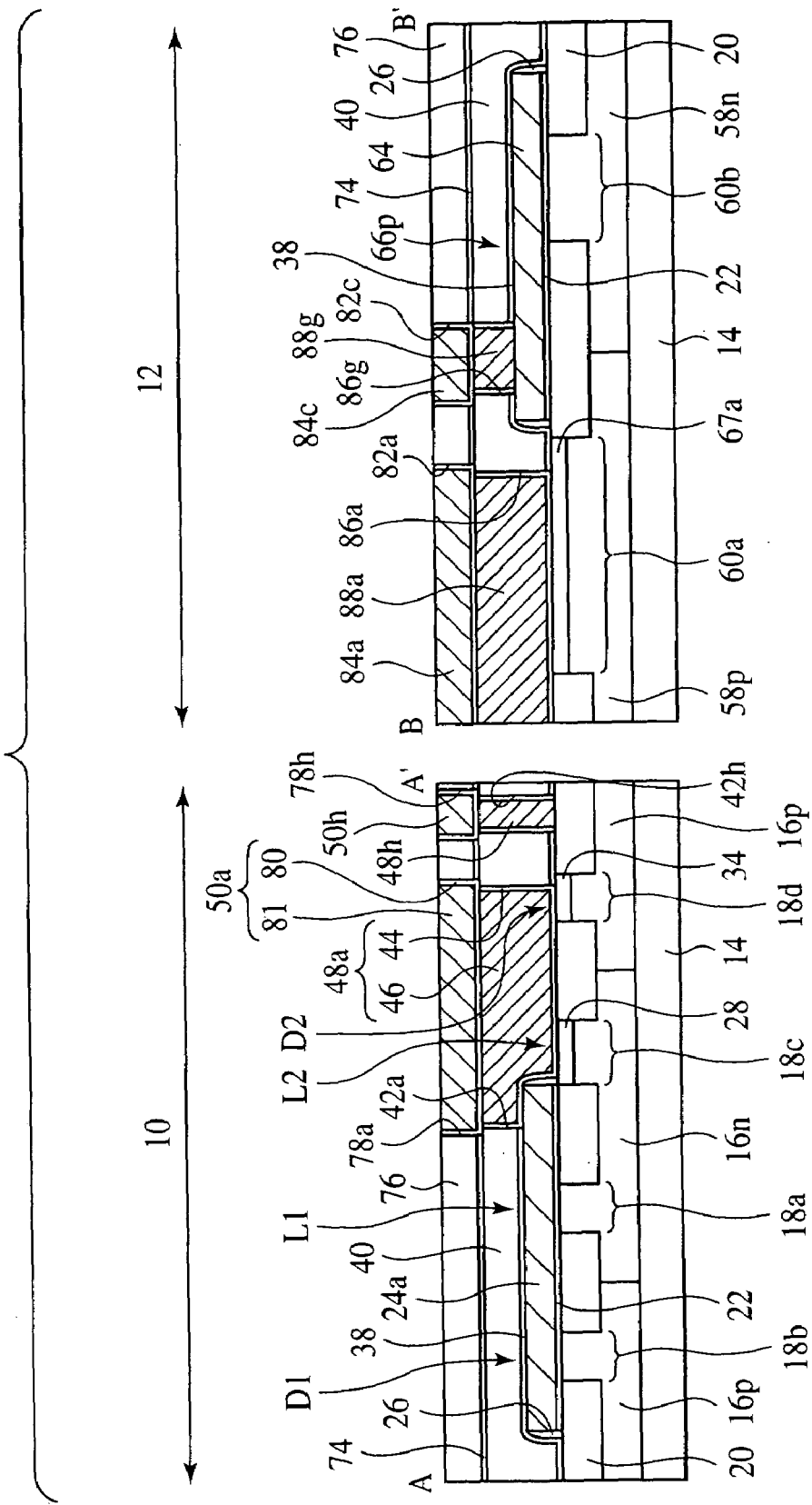
FIG. 23 is a sectional view of the semiconductor device according to a second embodiment of the present invention.
Figure 24:
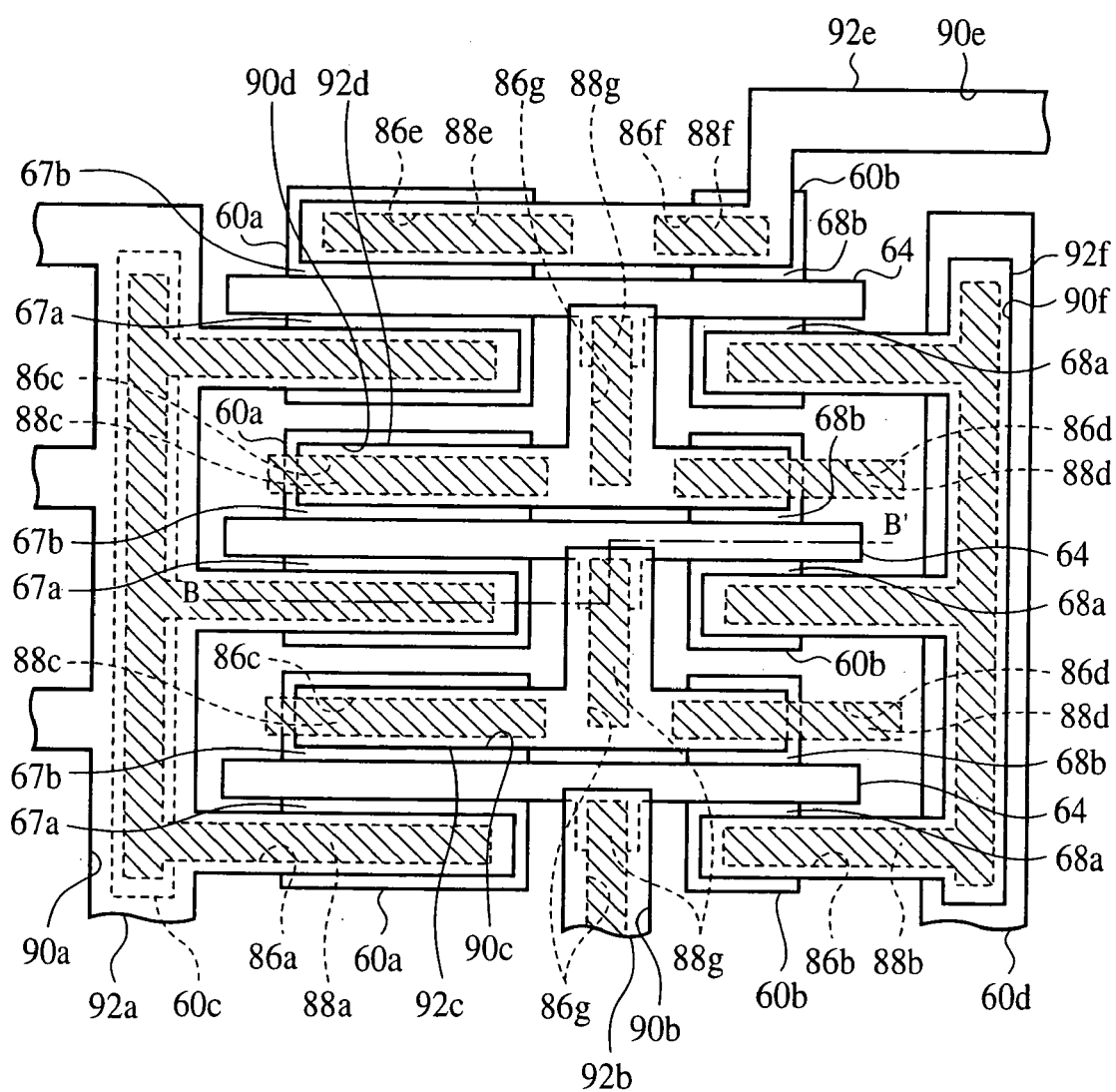
FIG. 24 is a plan view of the semiconductor device according to a second embodiment of the present invention.

The semiconductor device according to a second embodiment of the present invention and the method for fabricating the semiconductor device will be explained with reference to FIGS. 23 to 28. FIG. 23 is a sectional view of the semiconductor device according to the present embodiment. FIG. 24 is a plan view of the semiconductor device according to the present embodiment. The same members of the present embodiment as those of the semiconductor device according to the first embodiment and the method for fabricating the semiconductor device shown in FIGS. 1 to 22 are represented by the same reference numbers not to repeat or simplify their explanation.

(The Semiconductor Device)

First, the semiconductor device according to the present embodiment will be explained with reference to FIGS. 23 and 24.

The semiconductor device according to the present embodiment is characterized mainly in that groove-shaped openings 86a–86g are formed in an inter-layer insulation film 40 not only in a memory cell region 10 but also in a peripheral circuit region 12, and contact layer 88a–88g is buried in the groove-shaped openings 86a–86g.

The memory cell region 10 is the same as that of the semiconductor device shown in FIGS. 1 and 2, and its explanation is omitted.

Then, the peripheral circuit region 12 will be explained.

As shown in FIGS. 23 and 24, the groove-shaped opening 86a for exposing a source/drain diffused layer 67a and a device region 60c is formed in the inter-layer insulation film 40. The groove-shaped opening 86b for exposing the source/drain diffused layer 68a and the device region 60d is formed in the inter-layer insulation film 40. The groove-shaped opening 86c for exposing the source/drain diffused layer 67b is formed in the inter-layer insulation film 40. The groove-shaped opening 86d for exposing the source/drain diffused layer 68b is formed in the inter-layer insulation film 40. The groove-shaped opening 86e for exposing the source/drain diffused layer 67b is formed in the inter-layer insulation film 40. The groove-shaped opening 86f for exposing the source/drain diffused layer 68b is formed in the inter-layer insulation film 40. The groove-shaped opening 86g for exposing a gate interconnection 64 is formed in the inter-layer insulation film 40.

In the groove-shaped openings 86a–86g, contact layer 88a–88g of a barrier film 44 and a tungsten film 46 is buried.

On the inter-layer insulation film 40 with the contact layer 88a–88g buried in, a stopper film 74 and an inter-layer insulation film 76 are formed.

The groove-shaped opening 90a for exposing the contact layer 88a is formed in the inter-layer insulation film 76 and the stopper film 74. The groove-shaped opening 90a is formed along the contact layer 88a. The groove-shaped opening 90b for exposing the contact layer 88g is formed in the inter-layer insulation film 76 and the stopper film 74. The groove-shaped opening 90b is formed along the contact layer 88g. The groove-shaped opening 90c for exposing the contact layer 88c, 88d, 88g is formed in the inter-layer insulation film 76 and the stopper film 74. The groove-shaped opening 90c is formed along the contact layer 88c, 88d, 88g. The groove-shaped opening 90d for exposing the contact layer 88c, 88d, 88g is formed in the inter-layer insulation film 76 and the stopper film 74. The groove-shaped opening 90d is formed along the contact layer 88c, 88d, 88g. The groove-shaped opening 90e for exposing the contact layer 88e, 88f is formed in the inter-layer insulation film 76 and the stopper film 74. The groove-shaped opening 90e is formed along the contact layer 88e, 88f. The groove-shaped opening 90f for exposing the contact layer 88b is formed in the inter-layer insulation film 76 and the stopper film 74. The groove-shaped opening 90f is formed along the contact layer 88b.

The contact layer 92a–92f is buried in the respective groove-shaped openings 90a–90f.

Thus, the semiconductor device according to the present embodiment is constituted.

The semiconductor device according to the present embodiment is characterized mainly in that the groove-shaped openings 86a–86g are formed not only in the memory cell region 10 but also in the peripheral circuit region 12, and the contact layer 88a–88g is buried in the groove-shaped openings 86a–86g. The openings 86a–86g for the contact layer 88a–88g buried in are formed in groove-shapes, which permits them to be formed without failure even micronized. Accordingly, according to the present embodiment, even the peripheral circuit region 12 can be micronized without decreasing the reliability and fabrication yields.

(The Method for Fabricating the Semiconductor Device)

Figure 25:
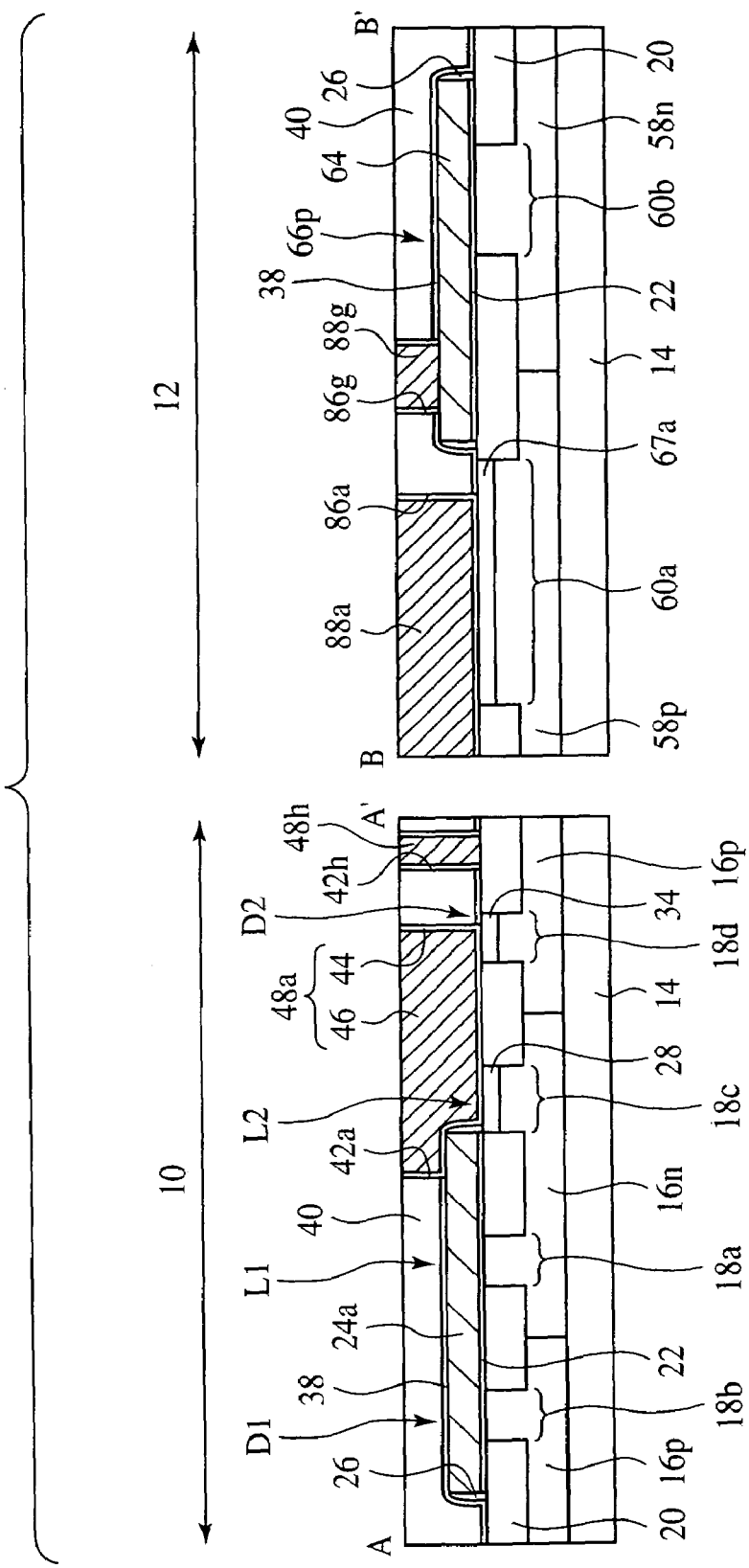
FIG. 25 is a sectional view of the semiconductor device according to the second embodiment of the present invention in the steps of the method for fabricating the same, which shows the method (Part 1).
Figure 26:
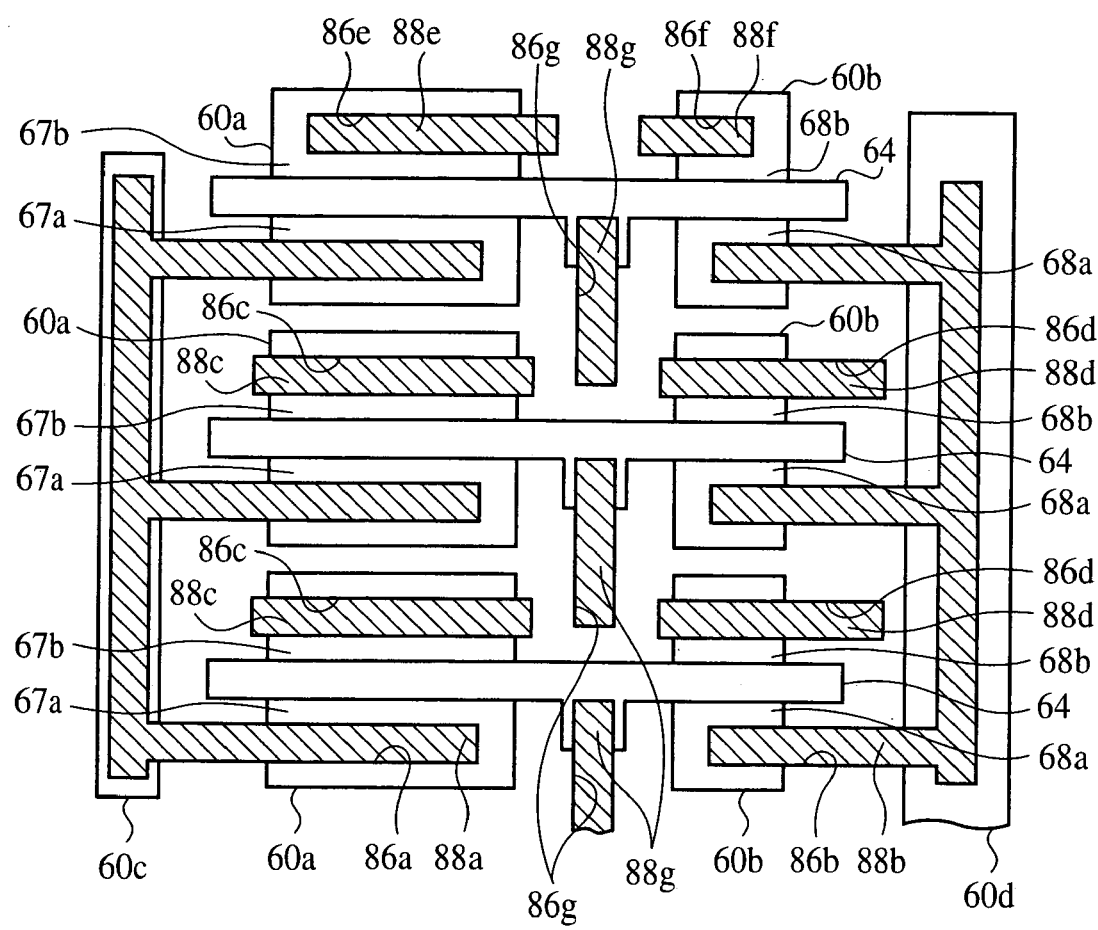
FIG. 26 is a plan view of the peripheral circuit region corresponding to the drawing of FIG. 25.
Figure 27:
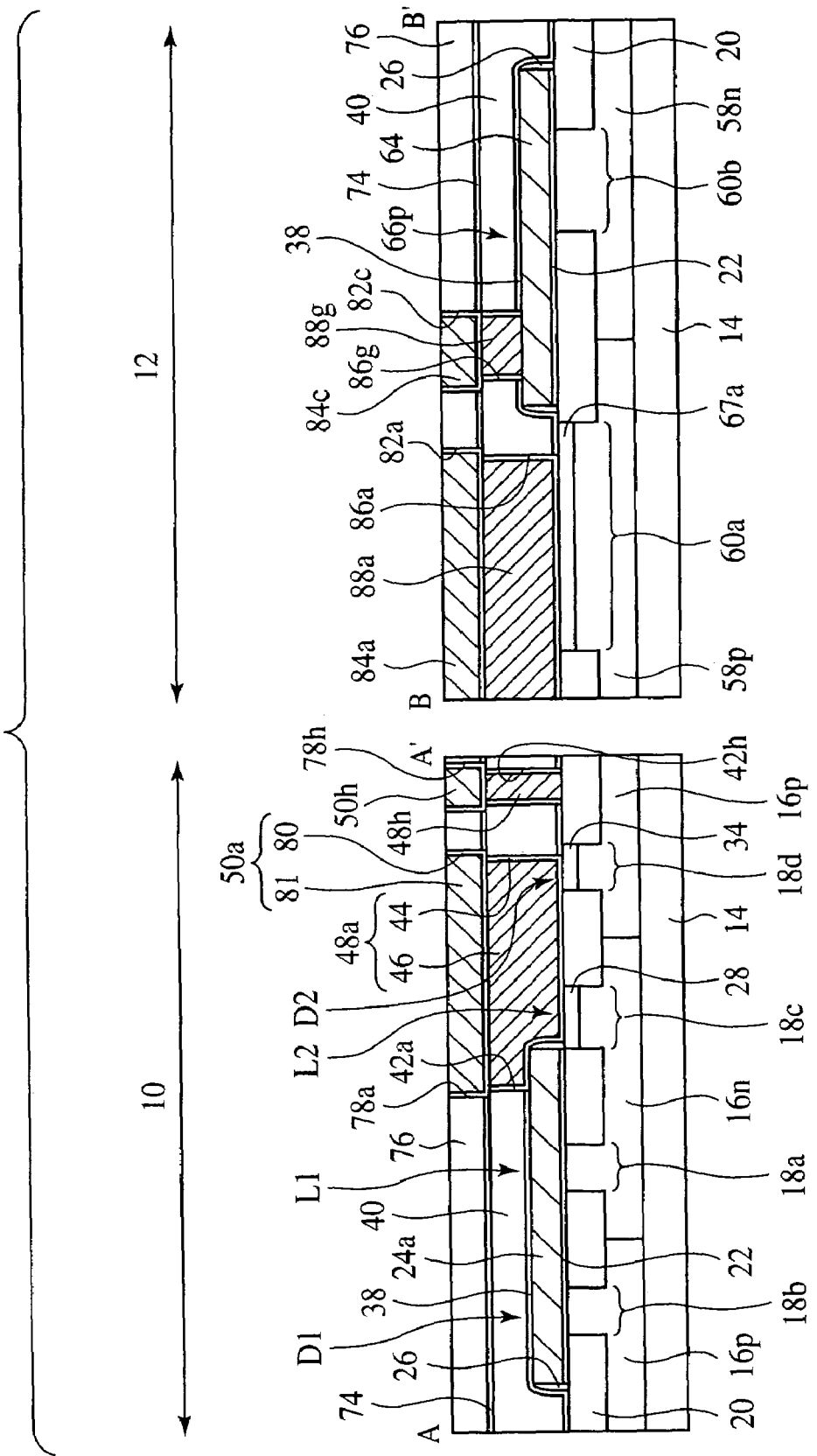
FIG. 27 is a sectional view of the semiconductor device according to the second embodiment of the present invention in the steps of the method for fabricating the same, which shows the method (Part 2).
Figure 28:
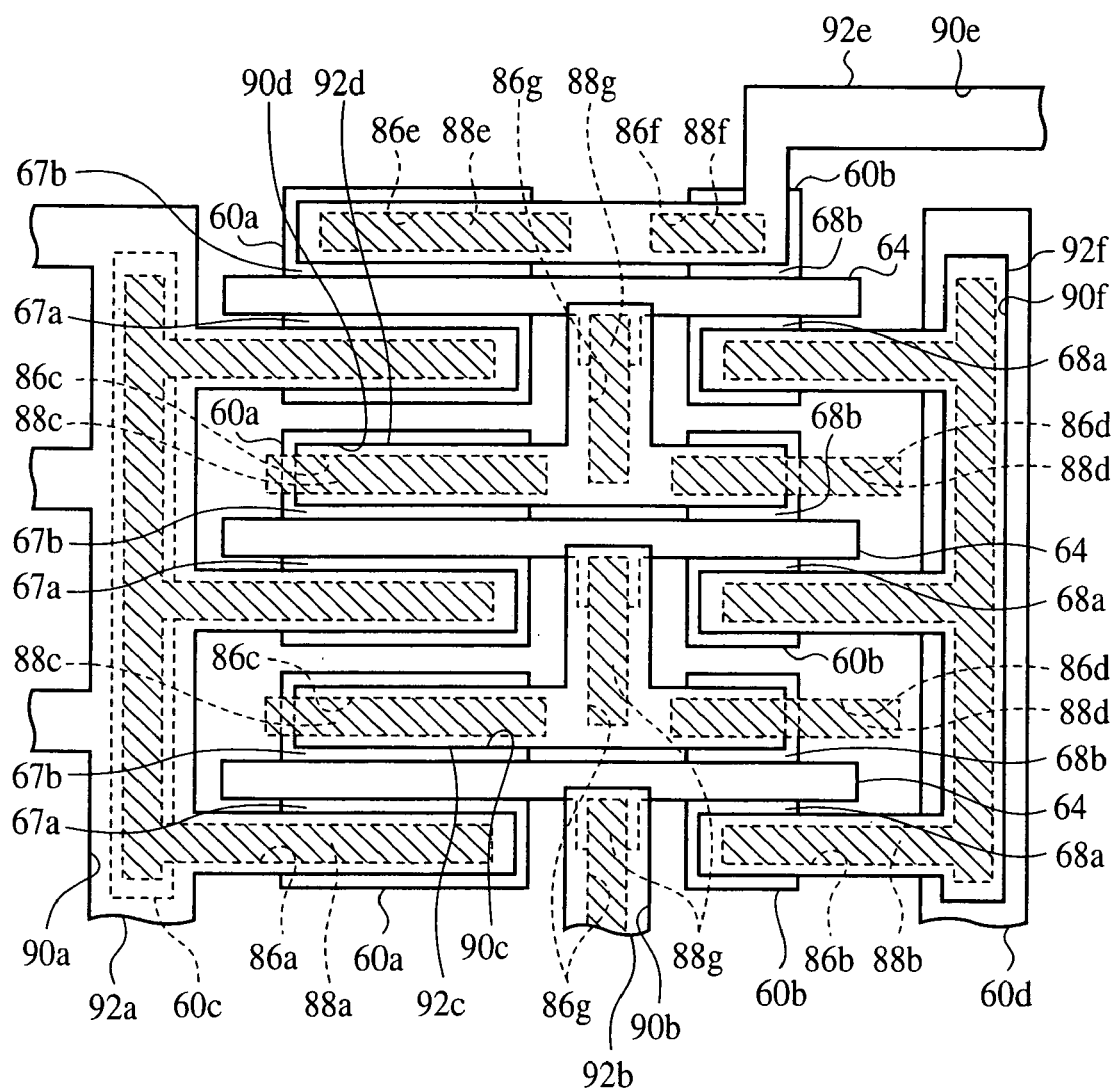
FIG. 28 is a plan view of the peripheral circuit region corresponding to the drawing of FIG. 27.

Next, the method for fabricating the semiconductor device according to the present embodiment will be explained with reference to FIGS. 25 to 28. FIG. 25 is a sectional view of the semiconductor device in the steps of the method for fabricating the semiconductor device, which show the method (Part 1). FIG. 26 is a plan view of the peripheral circuit region corresponding to the drawing shown in FIG. 25. FIG. 27 is a sectional view of the semiconductor device in the steps of the method for fabricating the semiconductor device, which shows the method (Part 2). FIG. 28 is a plan view of the peripheral circuit region corresponding to the drawing shown in FIG. 27.

First, the steps up to the step of planarizing the surface of the inter-layer insulation film 40 including the inter-layer insulation surface planarizing step are the same as in the method for fabricating the semiconductor device according to the first embodiment, and their explanation will not be repeated.

Then, a 80 nm-thickness anti-reflection film (not shown) is formed on the entire surface by, e.g., spin coating. The anti-reflection film is formed of, e.g., an organic material.

Then, in the same way as in the method for fabricating the semiconductor device according to the first embodiment, a 250 nm-thickness photoresist film (not shown) is formed on the entire surface by, e.g., spin coating. As in the first embodiment, the photoresist film is, e,g, a positive-type ArF excimer resist.

In exposing the photoresist film, zonal lighting, for example, is used as in the method for fabricating the semiconductor device according to the first embodiment. The zonal lighting is, e.g., 2/3 zonal lighting. The σ value is, e.g., 0.567/0.850. The number of apertures NA is, e.g., 0.75. The luminous exposure for exposing the photoresist film is, e.g., about 350 J/cm$^2$.

The reticule used in exposing the photoresist film is a halftone-type phase shift mask for the ArF excimer laser lithography as in the method for fabricating the semiconductor device according to the first embodiment. The transmittance t is, e.g., 6%.

Thus, the patterns are exposed in the photoresist film and developed. The openings of an about 90 nm-minimum size are thus formed in the photoresist film.

Then, with the photoresist film as the mask and with the stopper film 38 as the etching stopper, the inter-layer insulation film 40 is etched. Thus, the groove-shaped openings 42a–42j and the groove-shaped openings 86a–86g are formed in the inter-layer insulation film 40 (see FIGS. 18, 25, 26).

Next, the stopper film 38 exposed in the groove-shaped openings 42, 86 is etched off.

Thus, the groove-shaped openings 42a–42j are formed in the memory cell region 10, and in the peripheral circuit region 12, the groove-shaped openings 86a–86g are formed.

Then, a 10 nm-thickness Ti film and a 50 nm-thickness TiN film are sequentially laid by, e.g., sputtering to form the barrier film 44 of the Ti film and the TiN film.

Then, a 200 nm-thickness tungsten film 46 is formed by, e.g., CVD.

Then, the tungsten film 46 and the barrier film 44 are polished by, e.g., CMP until the surface of the inter-layer insulation film 40 is exposed. The contact layer 48a–48j is thus buried in the groove-shaped openings 42a–42j. The contact layer 88a–88g is buried in the groove-shaped openings 86a–86g.

Then, in the same way as in the method for fabricating the semiconductor device according to the first embodiment, the stopper film 74 is formed of a 30 nm-thickness SiC film by, e.g., CVD (see FIG. 27).

Next, in the same way as in the method for fabricating the semiconductor device according to the first embodiment, a 200 nm-thickness SiOC film, a 30 nm-thickness SiC film, a 150 nm-thickness silicon oxide film, a 100 nm-thickness silicon nitride film and a 10 nm-thickness silicon oxide film are sequentially formed by, e.g., CVD. Thus, the inter-layer insulation film 76 of the SiOC film, the SiC film, the silicon oxide film, the silicon nitride film and the silicon oxide film is formed.

Then, in the same way as in the method for fabricating the semiconductor device according to the first embodiment, a 80 nm-thickness anti-reflection film (not shown) is formed on the entire surface by, e.g., spin coating. The anti-reflection film is formed of, e.g., an organic material.

Next, in the same way as in the method for fabricating the semiconductor device according to the first embodiment, a 250 nm-thickness photoresist film (not shown) is formed on the entire surface by, e.g., spin coating. The photoresist film is, e.g., a positive-type ArF excimer resist.

Then, in the same way as in the method for fabricating the semiconductor device according to the first embodiment, the photoresist film is exposed and developed by photolithography. Conditions for the exposure and the development are the same as the conditions for exposing and developing the photoresist film for forming, e.g., the groove-shaped openings 42a–42i, 86a–86g.

Next, in the same way as in the method for fabricating the semiconductor device according to the first embodiment, with the photoresist film as the mask and with the stopper film 74 as the etching stopper, the inter-layer insulation film 76 is etched. Thus, the groove-shaped openings 78a–78j, 90a–90f for burying the interconnections 50a–50j, 90a–92f are formed in the inter-layer insulation film 76 (see FIGS. 21 and 28).

Then, the stopper film 74 exposed in the groove-shaped openings 78a–78j, 90a–90f is etched off.

Next, the barrier film 80 of, e.g., Ta (tantalum) is formed in a 20 nm-thickness on the entire surface by, e.g., sputtering.

Then, the Cu (copper) film 81 of an about 1 μm-thickness is formed by, e.g., plating.

Then, the Cu film 81 and the barrier film 80 are polished by, e.g., CMP until the surface of the inter-layer insulation film 76 is exposed. Thus, the interconnections 50a–50j, 92a–92f of the Cu film 81 and the barrier film 80 are buried in the groove-shaped openings 78a–78j, 90a–90f.

The semiconductor device according to the present embodiment is thus fabricated.

[A Third Embodiment]

Figure 29:
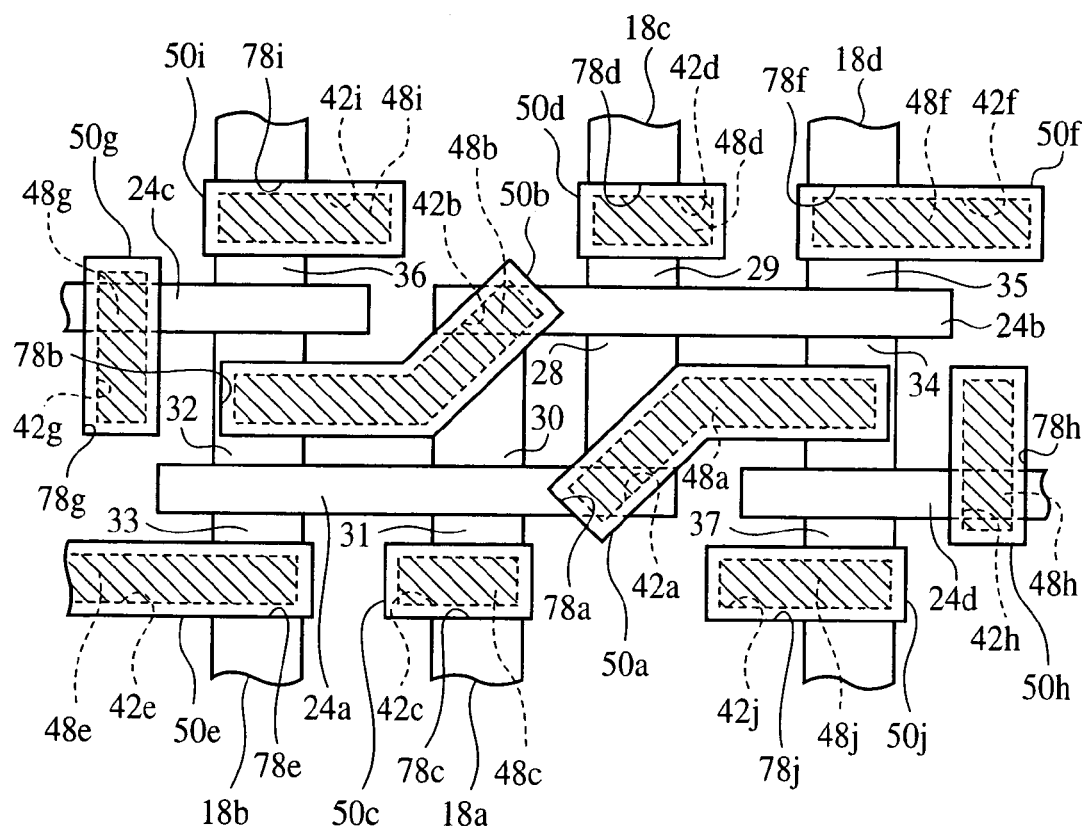
FIG. 29 is a plan view of the semiconductor device according to a third embodiment of the present invention.

The semiconductor device according to a third embodiment of the present invention will be explained with reference to FIG. 29. FIG. 29 is a plan view of the semiconductor device according to the present embodiment. The same members of the present embodiment as those of the semiconductor device according to the first or the second embodiment and the method for fabricating the semiconductor device are represented by the same reference numbers not to repeat or to simplify their explanation.

The semiconductor device according to the present embodiment is characterized mainly in that contact layer 48a, 48b is formed diagonally to the longitudinal direction of gate interconnections 24a, 24b in the regions near the gate interconnections 24a, 24b.

As shown in FIG. 29, the contact layer 48a is formed along the gate interconnection 24b in the region remote from the gate interconnection 24a and diagonally to the longitudinal direction of the gate interconnections 24a, 24b in the region near the gate interconnection 24a.

The contact layer 48b is formed along the gate interconnection 24a in the region remote from the gate interconnection 24b and diagonally to the longitudinal direction of the gate interconnections 24a, 24b in the region near the gate interconnection 24b.

As in the first and the second embodiments, a stopper film 74 and an inter-layer insulation film 76 are formed on an inter-layer insulation film 40 with the contact layer 48a–48j buried in (see FIG. 1).

Groove-shaped openings 78a–78j for exposing the contact layer 48a–48j are formed in the stopper film 74 and the inter-layer insulation film 76. The groove-shaped openings 78a–78j are formed along the contact layer 48a–48j.

Interconnections 50a–50j are buried in the groove-shaped openings 78a–78j. The interconnections 50a–50j are formed along the contact layer 48a–48j.

In the present embodiment, the contact layer 48a is formed diagonally to the longitudinal direction of the gate interconnection 24a in the region near the gate interconnection 24a, whereby even when disalignment takes place in forming the patterns, the gate interconnection 24a, the source/drain diffused layer 28 and the source/drain diffused layer 29 can be connected by the contact layer 48a without failure. The contact layer 48b is formed diagonally to the longitudinal direction of the gate interconnection 24b in the region near the gate interconnection 24b, whereby even when disalignment takes place in forming the patterns, the gate interconnection 24b, the source/drain diffused layer 30 and the source/drain diffused layer 32 can be connected by the contact layer 48b without failure. In forming the gate interconnections 24a, 24b, when the forward ends of the patterns of the gate interconnections 24a, 24b set back, the gate interconnections 24a, the source/drain diffused layer 28 and the source/drain diffused layer 34 can be connected without failure, and the gate interconnection 24b, the source/drain diffused layer 30 and the source/drain diffused layer 32 can be connected without failure. Thus, the semiconductor device according to the present embodiment can have high reliability and high fabrication yields.

(Modification)

Figure 30:
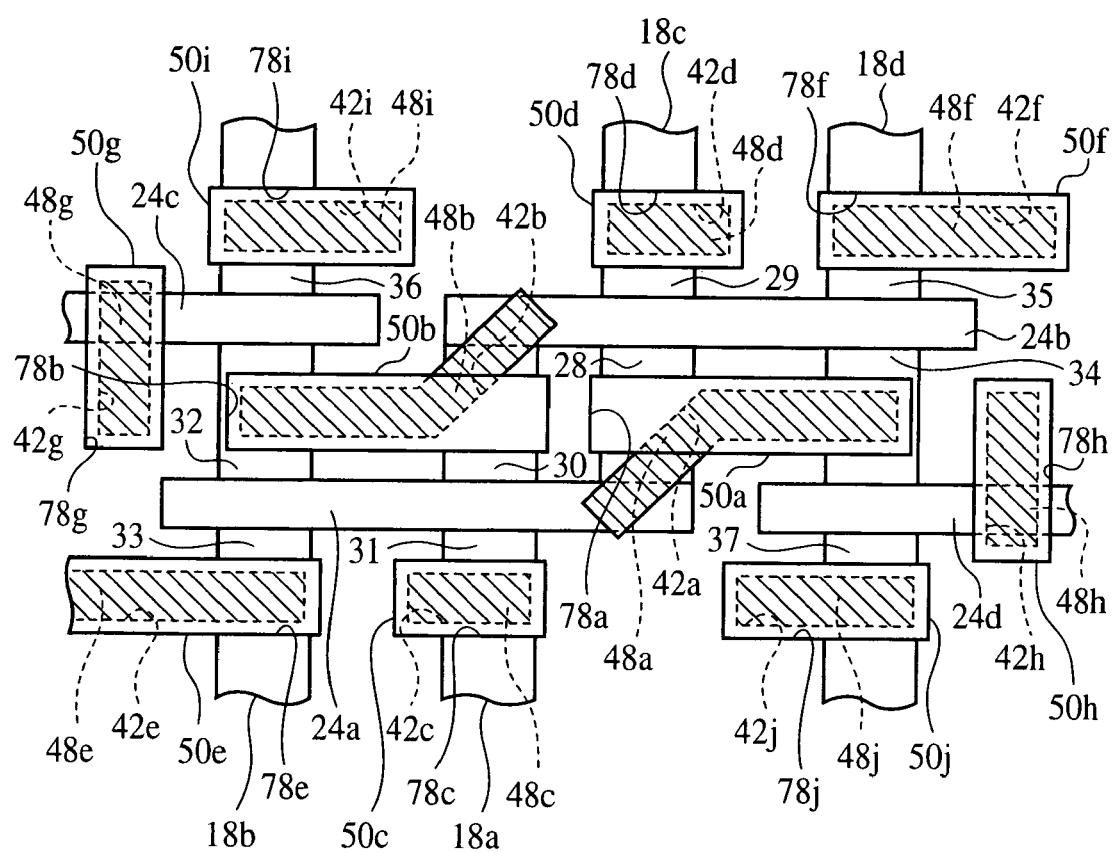
FIG. 30 is a plan view of the semiconductor device according to a modification of the third embodiment of the present invention.

Then, a modification of the semiconductor device according to the present embodiment will be explained with reference to FIG. 30. FIG. 30 is a plan view of the semiconductor device according to the present modification.

The semiconductor device according to the present modification is characterized mainly in that the contact layer 48a, 48b are formed diagonally to the longitudinal direction of the gate interconnections 24a, 24b in the region near the gate interconnections 24a, 24b, and the interconnections 50a, 50b are formed linearly in parallel with the gate interconnections 24a, 24b.

As shown in FIG. 30, the interconnections 50a, 50b are formed linearly in parallel with the gate interconnections 24a, 24b.

In the present modification, the interconnections 50a, 50b are formed linear, which facilitates forming the photo mask for patterning the interconnections 50a. 50b. Accordingly, the present embodiment can contribute to the cost reduction.

[A Fourth Embodiment]

Figure 31:
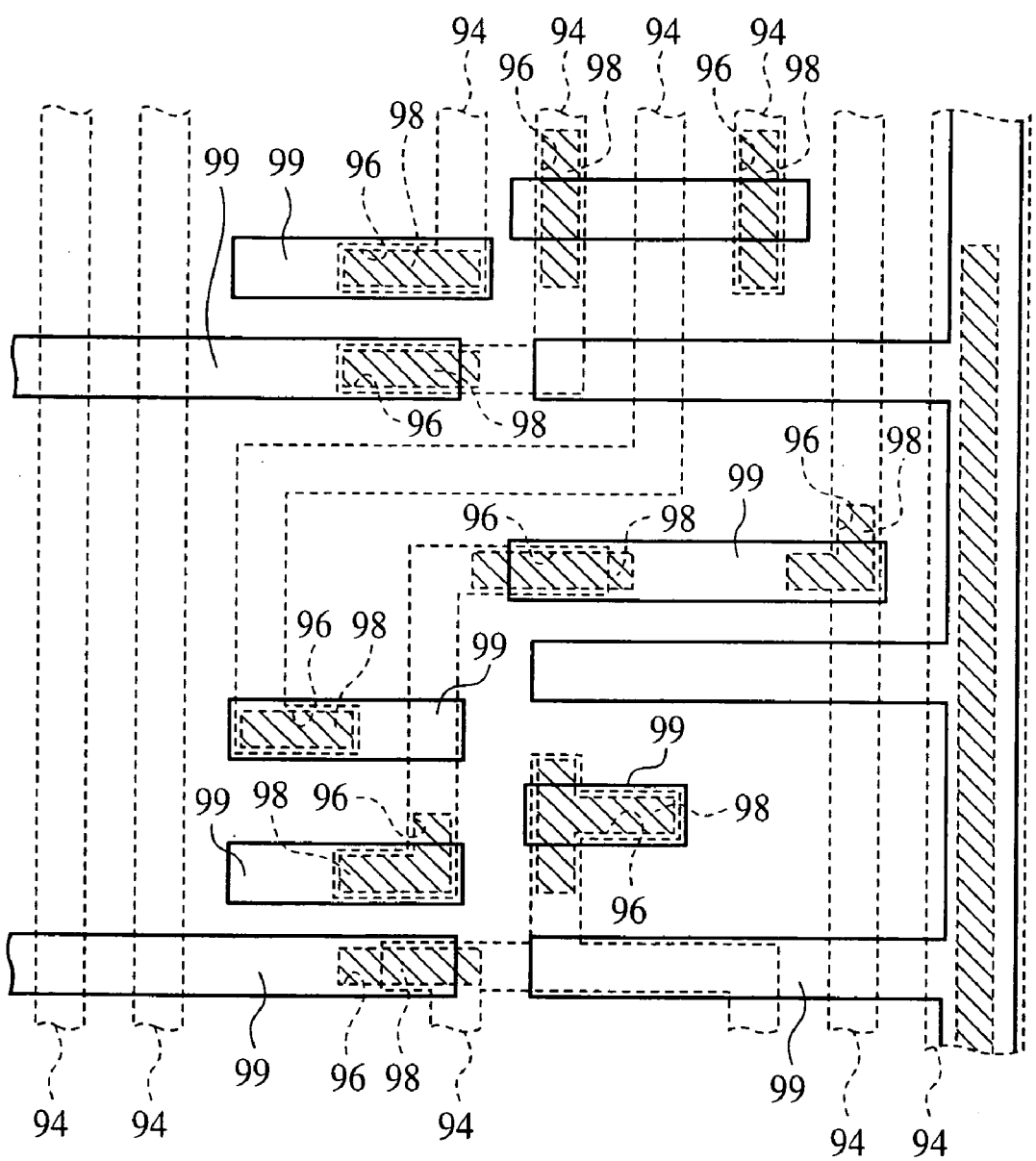
FIG. 31 is a plan view of the semiconductor device according to a fourth embodiment of the present invention.

The semiconductor device according to a fourth embodiment of the present invention will be explained with reference to FIG. 31. FIG. 31 is a plan view of the semiconductor device according to the present embodiment. The same members of the present embodiment as those of the semiconductor device according to the first to the third embodiments and the method fabricating the semiconductor device shown in FIGS. 1 to 30 are represented by the same reference numbers not to repeat or to simplify their explanation.

The semiconductor device according to the present embodiment is characterized mainly in that a contact layer is buried in groove-shaped openings for exposing a lower interconnection, and the lower interconnections and the upper interconnections are connected by the contact layers buried in the groove-shaped openings.

An inter-layer insulation film not shown is formed on the lower interconnections 94.

The groove-shaped openings 96 for exposing the lower interconnections 94 are formed in the inter-layer insulation film. The groove-shaped openings 96 are formed along the lower interconnections 94. The groove-shaped openings 96 may be larger than the lower interconnections 94. A contact layer 98 is buried in the groove-shaped openings 96.

On the inter-layer insulation film (not shown) with the contact layer 98 buried in, upper interconnections 99 are buried.

Thus, the semiconductor device according to the present embodiment is constituted.

As described above, the contact layer 98 is buried in the groove-shaped openings 96 for exposing the lower interconnections 94, and the lower interconnections 96 and the upper interconnections 99 may be connected by the contact layer 98 buried in the groove-shaped openings 96. As described above, the groove-shaped openings 96 can be formed without failure even when micronized, and the contact layer 98 can be buried in the groove-shaped openings 96 without failure. Thus, the semiconductor device according to the present embodiment can be micronized without decreasing the reliability and yields.

(Modifications)

Figure 32:
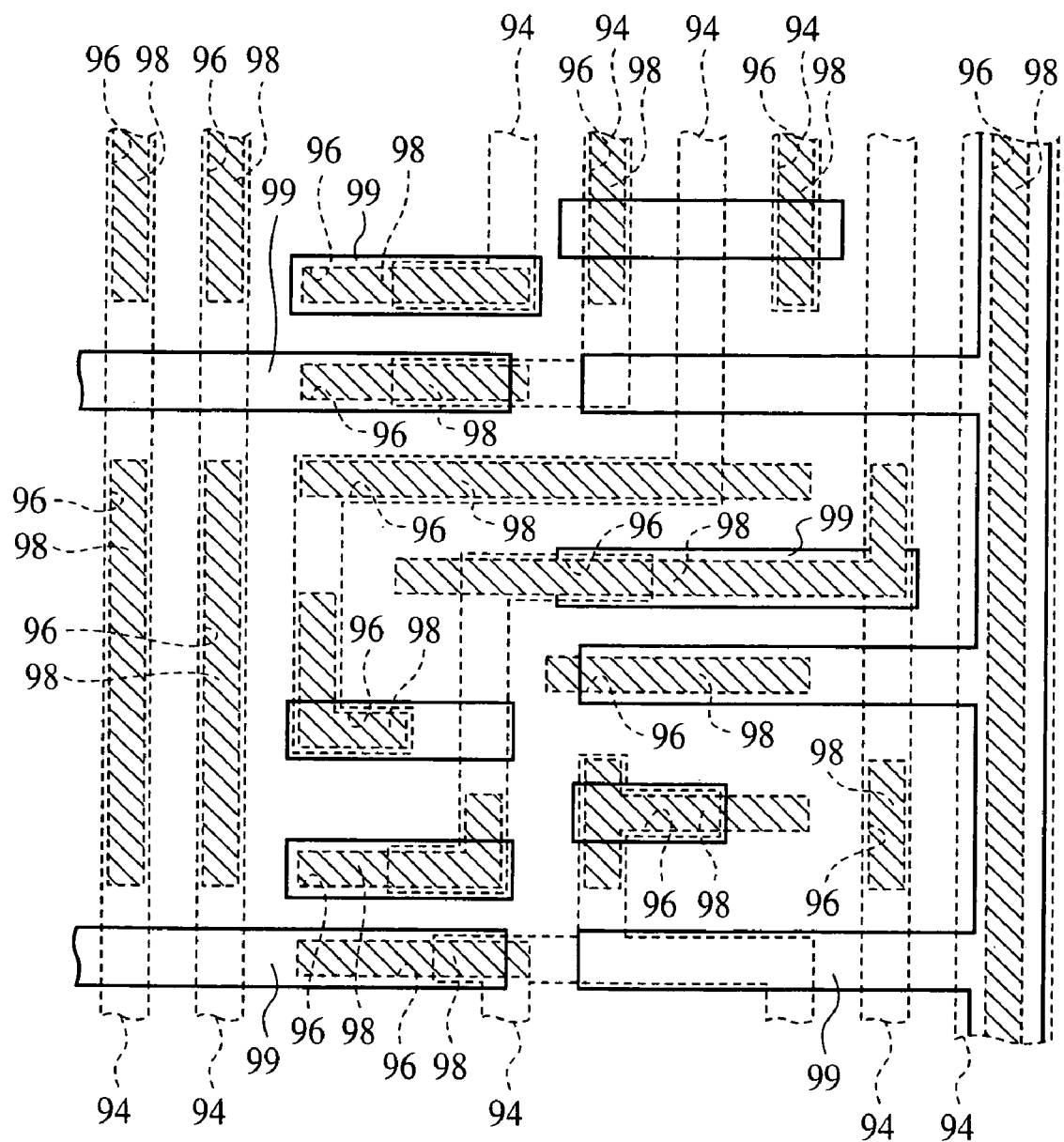
FIG. 32 is a plan view of the semiconductor device according to a modification of the fourth embodiment of the present invention.
Figure 33:
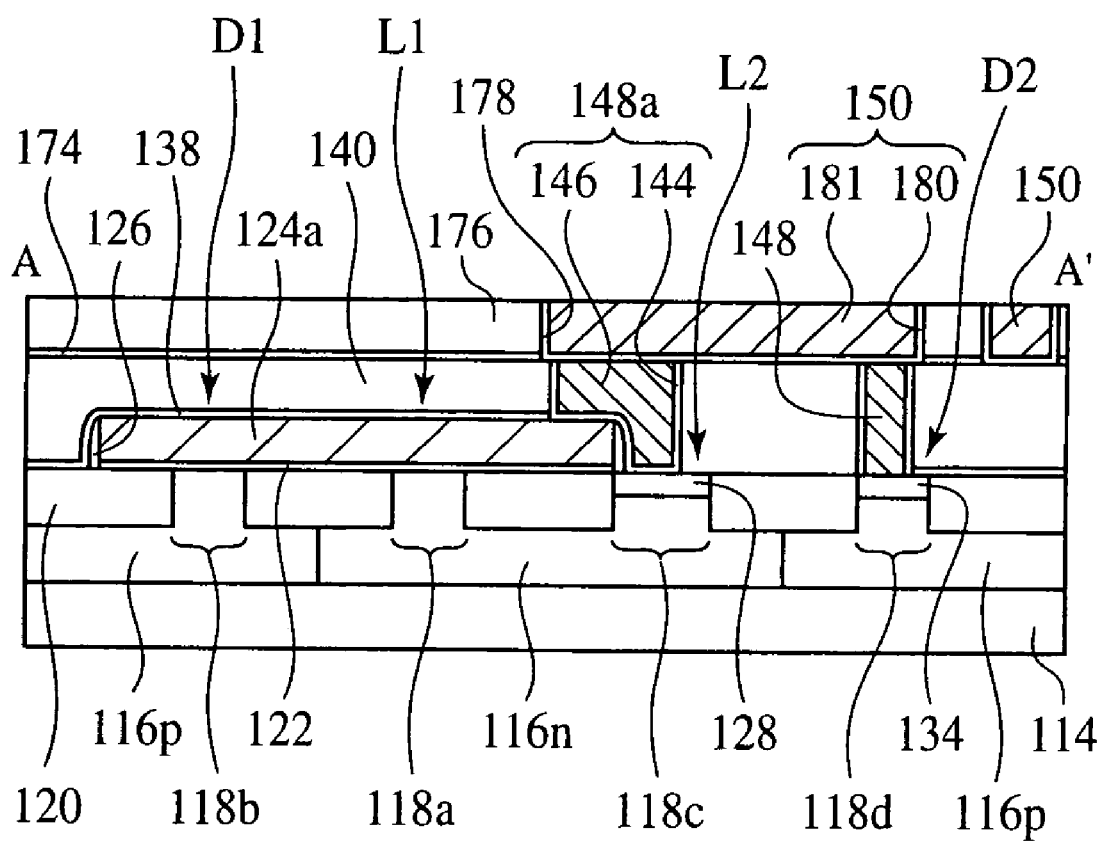
FIG. 33 is a sectional view of the proposed SRAM.
Figure 34:
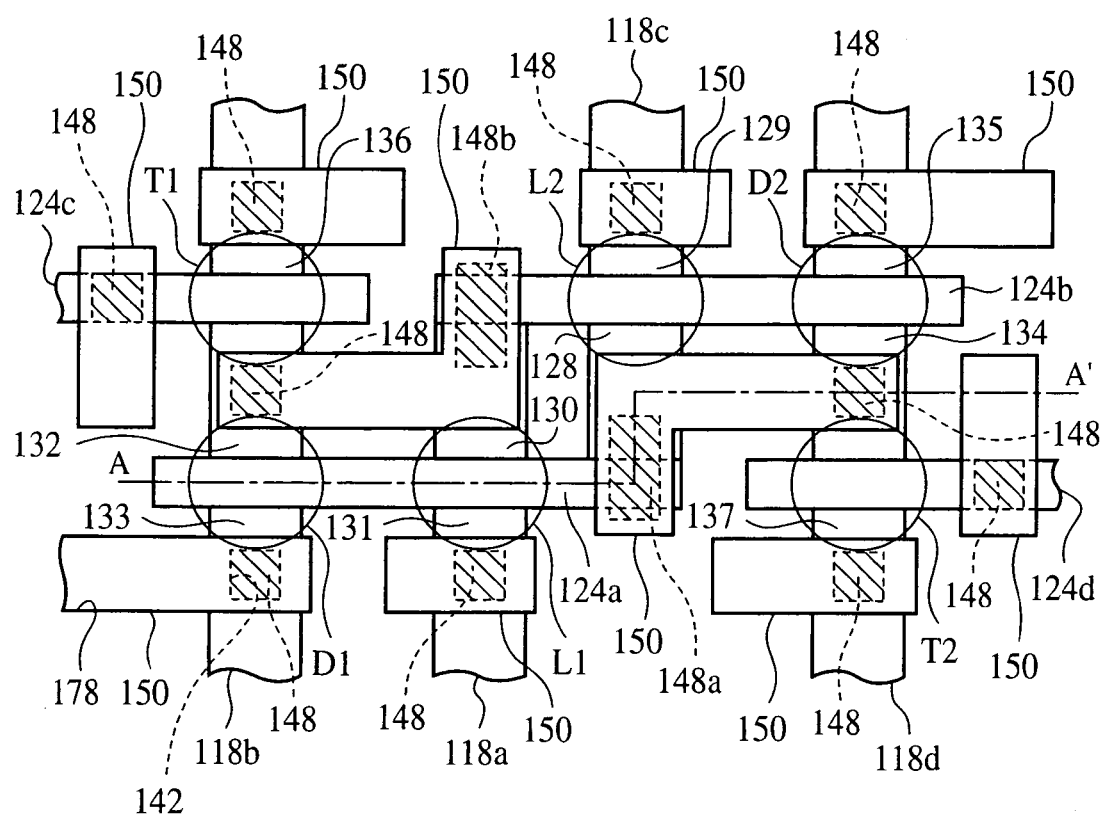
FIG. 34 is a plan view of the pattern of the proposed SRAM.

Then, the semiconductor device according to a modification of the present embodiment will be explained with reference to FIG. 32. FIG. 32 is a plan view of the semiconductor device according to the present modification.

The semiconductor device according to the present modification is characterized mainly in that the groove-shaped openings 96 are formed in wider regions to thereby increase the occupation ratio of the patterns by the groove-shaped openings 96.

As shown in FIG. 32, in the present modification, the length of the groove-shaped openings 96 is longer in comparison with that of the semiconductor device shown in FIG. 31. The groove-shaped openings 96 are formed in positions where the upper interconnections 94 and the upper interconnections 99 are connected, and the contact layer 98 is buried in the groove-shaped openings 96.

Thus, the semiconductor device according to the present modification is constituted.

According to the present modification, the occupation ratio of the patterns by the groove-shaped openings 96 is increased, whereby when exposing the patterns of the groove-shaped openings 96, good patterns can be formed. The formation of a large step on the substrate surface can be prevented when the contact layer 98 is buried in the groove-shaped openings 96 by CMP.

MODIFIED EMBODIMENTS

The present invention is not limited to the above-described embodiments and can cover other various modifications.

For example, the above-described embodiments have been explained by means of the SRAM. However, the principle of the present invention is not limited to the SRAM and is applicable to any semiconductor device.

What is claimed is:

1. A method for fabricating a semiconductor device comprising a first inverter including a first load transistor and a first driver transistor, and a second inverter including a second load transistor and a second driver transistor, the method further comprising the steps of:

forming over a semiconductor substrate a first gate interconnection including the gate electrode of the first load transistor, and the gate electrode of the first driver transistor; and a second gate interconnection including the gate electrode of the second load transistor and the gate electrode of the second driver transistor;

forming a source/drain diffused layer in the semiconductor substrate of both sides of the respective gate electrodes;

forming an insulation film over the semiconductor substrate, the first gate interconnection and the second gate interconnection;

forming in the insulation film a first groove-shaped opening for integrally exposing the first gate interconnection, one of the source/drain diffused layer of the second load transistor and one of the source/drain diffused layer of the second driver transistor; and a second groove-shaped opening for integrally exposing the second gate interconnection, one of the source/drain diffused layer of the first load transistor and one of the source/drain diffused layer of the first driver transistor; and burying a contact layer in the first opening and the second opening.

2. A method for fabricating a semiconductor device according to claim 1, wherein in the step of forming a first gate interconnection and a second gate interconnection, the gate electrode of a peripheral circuit transistor over the semiconductor substrate at the periphery of a memory cell region for a memory cell to be formed in, in the step of forming a source/drain diffused layer, the source/drain diffused layer of the peripheral circuit transistor is formed over the semiconductor substrate on both sides of the gate electrode of the peripheral circuit transistor, in the step of forming the first opening and the second opening, a third opening for exposing the gate electrode of the peripheral circuit transistor, and a fourth opening for exposing the source/drain diffused layer of the peripheral circuit transistor; and in the step of burying another contact layer, another contact layer is buried in the third opening and the fourth opening.

3. A method for fabricating a semiconductor device according to claim 2, wherein in the step of forming a first opening and a second opening, the third opening and the fourth opening are formed in a shape of groove respectively.

4. A method for fabricating a semiconductor device according to claim 2, comprising, after the step of burying a contact layer, the steps of:

forming another insulation film over the insulation film;

forming a groove-shaped fifth opening for respectively exposing the contact layers in said another insulation film respectively along the contact layers;

forming a groove-shaped sixth opening for respectively exposing said another contact layer; and burying interconnections respectively in the fifth opening and the sixth opening.

* * * * *